US006788164B2

(12) United States Patent
Maekawa et al.

(10) Patent No.: US 6,788,164 B2
(45) Date of Patent: Sep. 7, 2004

(54) COMPLEX HIGH FREQUENCY COMPONENTS

(75) Inventors: Tomoya Maekawa, Osaka (JP); Hiroshi Shigemura, Kyoto (JP); Hideaki Nakakubo, Kyoto (JP); Emiko Kawahara, Osaka (JP); Toru Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/209,893

(22) Filed: Aug. 2, 2002

(65) Prior Publication Data

US 2003/0025571 A1 Feb. 6, 2003

(30) Foreign Application Priority Data

Aug. 3, 2001 (JP) .................................... P2001-236830
May 27, 2002 (JP) .................................... P2002-152437

(51) Int. Cl.[7] .................................................. H03H 5/00

(52) U.S. Cl. .......................... 333/26; 333/25; 333/202; 333/204; 333/219

(58) Field of Search ........................... 333/25, 26, 202, 333/204, 219; 174/255

(56) References Cited

U.S. PATENT DOCUMENTS

| | | | | | |
|---|---|---|---|---|---|
| 4,803,453 | A | * | 2/1989 | Tomono et al. | 336/183 |
| 5,497,137 | A | * | 3/1996 | Fujiki | 336/200 |
| 6,525,626 | B2 | * | 2/2003 | Mandai et al. | 333/134 |
| 2002/0034934 | A1 | * | 3/2002 | Watanabe et al. | 455/318 |
| 2002/0175002 | A1 | * | 11/2002 | Sakakura et al. | 174/255 |
| 2003/0020568 | A1 | * | 1/2003 | Mizutani et al. | 333/204 |

FOREIGN PATENT DOCUMENTS

JP 7-176918 7/1995

* cited by examiner

*Primary Examiner*—Michael Tokar
*Assistant Examiner*—Khai Nguyen
(74) *Attorney, Agent, or Firm*—McDermott Will & Emery LLP

(57) ABSTRACT

The present invention comprises baluns 2*a*, 2*b* which convert balanced line signals and unbalanced line signals mutually, and filters 3*a*, 3*b* which are electrically connected to the baluns 2*a*, 2*b* and pass or attenuate the predetermined frequency bands. Electrode layers 15*a*–22*a*, 25*a*, 41, 42, 43 which compose the electrode patterns of the baluns 2*a*, 2*b* and the filters 3*a*, 3*b*, and the dielectric layers 30–39 are integrally stacked.

33 Claims, 12 Drawing Sheets

14 : unbalanced terminal
15, 17 : input/output coupling capacitor
16 : inter-stage coupling capaoitor
18, 19 : resonator
20 : first transmission line
21 : second transmission line
22 : third transmission line
23 : one end of balanced terminal
24 : aother end of altered terminal
25 : coupling capacitor

[FIG. 3]

14 : unbalanced terminal
15, 17 : input/output coupling capacitor
16 : inter-stage coupling capacitor
18, 19 : resonator
20 : first transmission line
21 : second transmission line
22 : third transmission line
23 : one end of balanced terminal
24 : aother end of altered terminal

【FIG. 4】

14a, 23a, 24a, 40 : terminal electrode
15a, 17a : input/output coupling capacitor electrode
16a : inter-stage coupling capacitor electrode layer
18a, 19a : resonator
20a : first transmission line
21a : second transmission line
22a : third transmission line
25a : coupling capacitor elctrode
30~39 : dielectric layers
41, 42, 43 : shield electrode
44, 45 : side electrode

【FIG. 5】

14a, 23a, 24a, 40 : terminal electrode
15a, 17a : input/output coupling capacitor electrode
16a : inter-stage coupling capacitor electrode layer
18a, 19a : resonator
20a : first transmission line
21a : second transmission line
22a : third transmission line
30~39 : dielectric layers
41, 42, 43 : shield electrode
44, 45 : side electrode

【FIG. 6】

54a～54e : dielectric substrate

COMPLEX HIGH FREQUENCY COMPONENTS

FIELD OF THE INVENTION

The present invention relates to complex high frequency components used in wireless circuits such as cellular phone terminals and also to communication devices using these components.

BACKGROUND OF THE INVENTION

Cellular phone terminals have been rapidly being downsized with their increased performance. In order to achieve their downsizing, each high frequency component used in a wireless circuit has been being miniaturized.

Conventional high frequency components used in a wireless circuit include a balanced to unbalanced transducer (hereinafter referred to as the balun). The balun is a device with the function of converting unbalanced line signals into balanced line signals, and vice versa. An example of a structure of the balun will be described as follows. FIG. 13 shows a chip trans as an example of the balun.

The chip trans has a multilayer structure of dielectric substrates 54_a_–34_e_. The dielectric substrates 54_a_, 54_e_ have shield electrode layers 56, 70, respectively, on one of their main surfaces. The dielectric substrate 54_b_ has a connection electrode layer 60 on one of its main surfaces. The dielectric substrate 54_c_ has a first strip line 62 on one of its main surfaces. The first strip line 62 is composed of first and second parts 64_a_, 64_b_ which are coiled. The dielectric substrate 54_d_ has second and third coiled strip lines 66, 68 which are coiled on one of its main surfaces. The second and third strip lines 66, 68 are electromagnetically coupled with the parts 64_a_, 64_b_, respectively, of the first strip line 62.

As described above, conventional baluns composed of a chip trans as shown in FIG. 13 have been being downsized. In addition, it has been being developed to downsize a filter with the function of selectively passing or attenuating the predetermined frequencies with respect to the high frequency signals to be supplied to or outputted to the balun.

However, the conventional balun and filter are mounted on different circuit substrates with each other, and this arrangement increases the number of components, thereby impeding cost reduction. This arrangement also makes it difficult not only to miniaturize a wireless circuit into which the balun and the filter are integrated but also to miniaturize a communication device like a cellular phone terminal into which the wireless circuit is integrated.

SUMMARY OF THE INVENTION

In view of the above situation, the present invention has an object of downsizing the high frequency component into which a balun and a filter are integrated, and thereby downsizing the communication device like a cellular phone terminal into which the high frequency component is integrated.

The other objects, features, and advantages of the present invention will be clarified below.

The present invention can be summarized as follows.

In order to solve the above-described problems, the complex high frequency components of the present invention each include a balun which mutually converts balanced line signals and unbalanced line signals, and a filter which is electrically connected to the balun and passes or attenuates the predetermined frequency bands. Such complex high frequency components of the present invention comprise an electrode layer and a dielectric layer which compose the electric patterns for the balun and the filter, and are integrally stacked.

Using these complex high frequency components can provide a communication device with a reduced size and excellent properties.

BRIEF DESCRIPTION OF THE DRAWINGS

These and other objects as well as advantages of the invention will become clear by the following description of preferred embodiments of the invention with reference to the accompanying drawings, wherein.

In all these figures, like components are indicated by the same numerals.

DETAILED DESCRIPTION OF PREFERRED EMBODIMENTS

Figure 1:
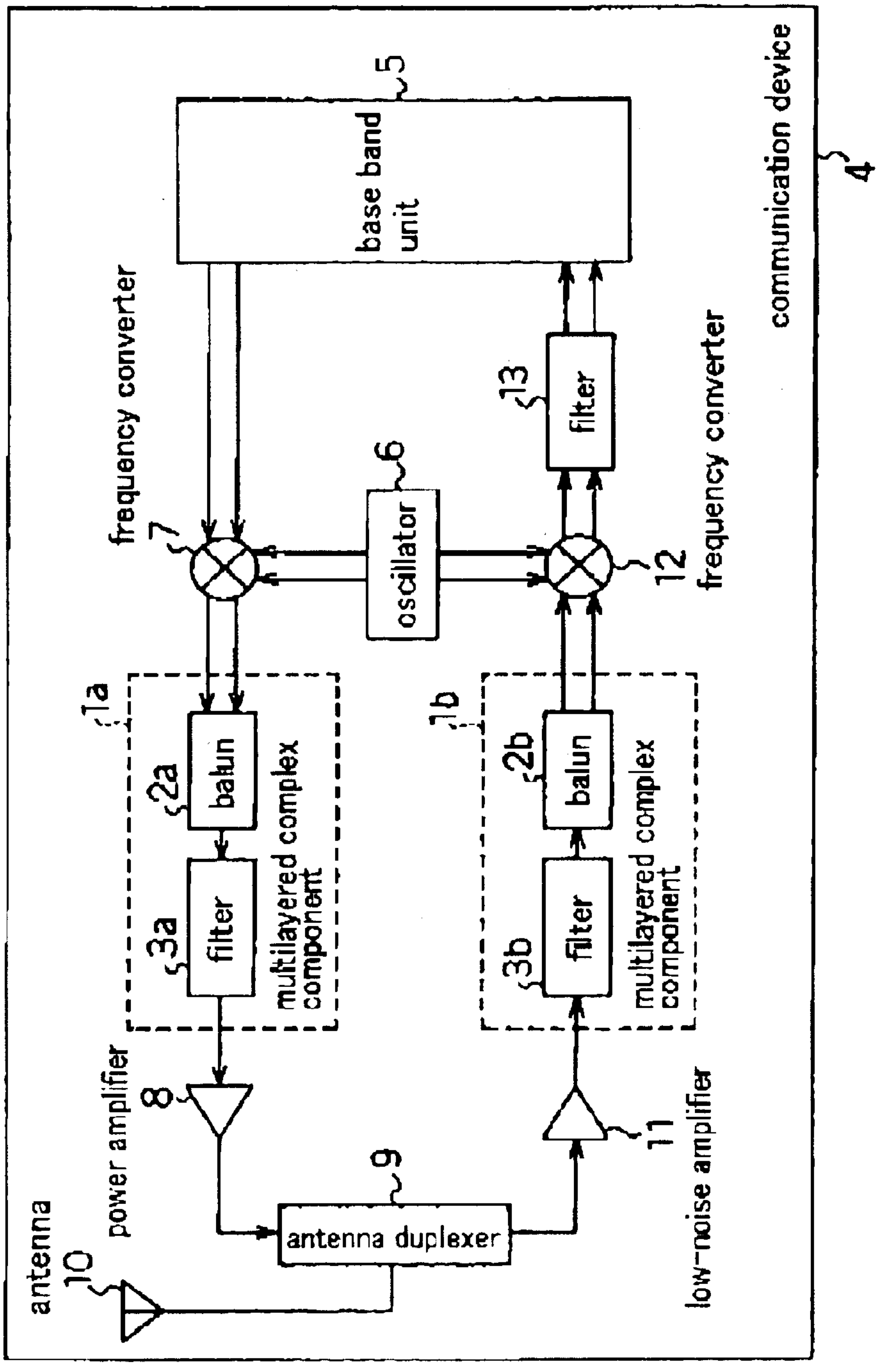
FIG. 1 is a block diagram showing a structure of the communication device in the first embodiment of the present invention.

The present invention will be detailed as follows based on the embodiments shown in the drawings.

(Embodiment 1)

FIG. 1 shows complex high frequency components 1_a_, 1_b_ of the first embodiment of the present invention and a communication device 4 using these components. The communication device 4 is a cellular phone terminal composed of a base band unit 5, an oscillator 6, a frequency converter 7, the complex high frequency component 1_a_, a power amplifier 8, an antenna duplexer 9, an antenna 10, a low-noise amplifier 11, the complex high frequency component 1_b_, a frequency converter 12, and a filter 13.

The complex high frequency component 1*a* includes a filter 3*a* and a balun 2*a*, which are integrated with each other to form a stacked component. Similarly, the complex high frequency component 1*b* includes a filter 3*b* and a balun 2*b*, which are integrated with each other to form a stacked component.

The base band unit 5 modulates base band signals, outputs base band modulation signals at the time of transmission, and demodulates the modulated waves into base band signals at the time of reception.

The frequency converter 7 produces transmitting signals by frequency-converting base band modulation signals.

The balun 2*a* converts transmitting signals outputted as balanced line signals from the frequency converter 7 into unbalanced line signals.

The filter 3*a* reduces the unnecessary frequency bands in the transmitting signals converted into the unbalanced line signals at the balun 2*a*.

The power amplifier 8 amplifies transmitting signals whose unnecessary frequency bands have been reduced at the balun 2*a*.

The antenna duplexer 9 achieves separation between transmitting signals and receiving signals.

The antenna 10 transmits transmitting signals in the form of transmitting waves and receives receiving waves in the form of receiving signals.

The oscillator 6 oscillates the high-frequency signals used in the frequency converter 7 in order to frequency-convert modulation signals into transmitting signals at the time of transmission. The oscillator 6, on the other hand, oscillates the high-frequency signals used in the frequency converter 12 in order to convert receiving signals into signals with the frequencies suitable to be outputted to the base band unit 5 at the time of reception.

The low-noise amplifier 11 amplifies receiving signals at low noise.

The filter 3*b* reduces the unnecessary frequency bands in the amplified receiving signals outputted from the low-noise amplifier 11.

The balun 2*b* converts the amplified receiving signals outputted as unbalanced line signals from the filter 3*b* into balanced line signals.

The frequency converter 12 converts the balanced line signals outputted from the balun 2*b* into signals with the frequencies suitable to be outputted to the base band unit 5.

The filter 13 reduces the unnecessary frequency bands in the signals frequency-converted at the frequency converter 12.

Operations of the communication device 4 will be described as follows.

First, transmitting operations will be described. The base band unit 5 modulates base band signals which are audio signals entered through a microphone or the like and outputs modulation signals. The frequency converter 7 mixes the modulation signals modulated at the base band unit 5 with carrier wave signals entered from the oscillator 6, thereby frequency-converting the modulation signals into transmitting signals.

The base band unit 5, the frequency converter 7, and the oscillator 6 function as a balanced line. Therefore, the transmitting signals outputted from the frequency converter 7 become balanced line signals. The balun 2*a* converts the transmitting signals outputted from the frequency converter 7 into unbalanced line signals. The filter 3*a* reduces the unnecessary frequency bands of the transmitting signals. The power amplifier 8 amplifies the output signals of the filter 3*a* and outputs them as transmitting signals. The antenna duplexer 9 guides the transmitting signals to the antenna 10 and makes the antenna 10 output them as transmitting waves.

The filter 3*a*, the power amplifier 8, the antenna duplexer 9, and the antenna 10 function as an unbalanced line.

The following is a description about receiving operations. The antenna 10 receives receiving waves. The antenna duplexer 9 guides the receiving signals received by the antenna 10 to the low-noise amplifier 11 on the reception side. The low-noise amplifier 11 amplifies the receiving signals. The filter 3*b* reduces signals having unnecessary frequency bands in the output signals of the low-noise amplifier 11.

The antenna 10, the antenna duplexer 9, the low-noise amplifier 11, and the filter 3*b* function as an unbalanced line. Therefore, the signals outputted from the filter 3*b* become unbalanced line signals. The balun 2*b* converts the signals outputted from the filter 3*b* into balanced line signals. The frequency converter 12 mixes the frequency-converting carrier waves supplied from the oscillator 6 with the signals outputted from the balun 2*b*, and converts them into frequency signals for the base band unit 5. The filter 13 reduces the unnecessary frequency bands of the frequency-converted signals. The base band unit 5 demodulates the output signals of the filter 13. The demodulated signals are outputted from a loudspeaker (not illustrated) or the like as voice. The oscillator 6, the frequency converter 12, the filter 13, and the base band unit 5 function as a balanced line.

The complex high frequency components 1*a*, 1*b* to be integrated into the communication device 4 will be described as follows.

Figure 2:
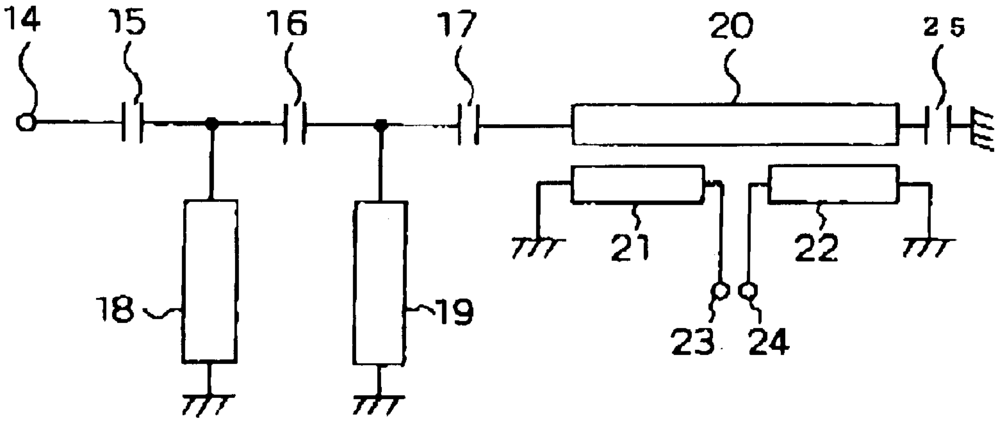
FIG. 2 is an equivalent circuit diagram of the complex high frequency components in the first embodiment.

FIG. 2 shows an equivalent circuit of the complex high frequency components 1*a*, 1*b*. In this equivalent circuit, the filters 3*a*, 3*b* are composed of an unbalanced terminal 14, input/output coupling capacitors 15, 17, an inter-stage coupling capacitor 16, and resonators 18, 19.

The baluns 2*a*, 2*b* are composed of a first transmission line 20, a second transmission line 21, a third transmission line electrode layer 22, balanced terminals 23, 24, and a coupling capacitor 25.

One of the edge electrodes of the input/output coupling capacitor 15 is connected to the unbalanced terminal 14, and the other edge electrode of the input/output coupling capacitor 15 is connected to one of the edge electrodes of the inter-stage coupling capacitor 16. The other edge electrode of the inter-stage coupling capacitor 16 is connected to one of the edge electrodes of the input/output coupling capacitor 17. In this manner, the input/output coupling capacitor 15, the inter-stage coupling capacitor 16, and the input/output coupling capacitor 17 are connected in series to the unbalanced terminal 14 in that order.

The other edge electrode of the input/output coupling capacitor 15 and one edge electrode of the inter-stage coupling capacitor 16 are connected to the resonator 18. The other edge electrode of the inter-stage coupling capacitor 15 and one edge electrode of the input/output coupling capacitor 17 are connected to the resonator 19.

The other edge electrode of the input/output coupling capacitor 17 is connected to one end of the first transmission line 20. The other end of the first transmission line 20 is connected to one of the edge electrodes of the coupling capacitor 25. The other edge electrode of the coupling capacitor 25 is grounded.

The balanced terminal 23 is connected to one end of the second transmission line 21, and the other end of the second transmission line 21 is grounded. The balanced terminal 24 is connected to one end of the third transmission line 22, and the other end of the third transmission line 22 is grounded.

The filters 3*a*, 3*b* can be notch filters, low pass filters, or high pass filters. The baluns 2*a*, 2*b* can have a different circuit structure from the one described above.

Figure 3:
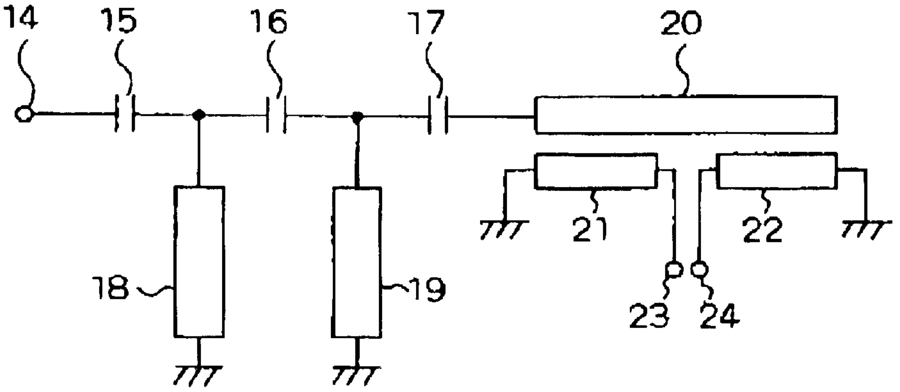
FIG. 3 is another equivalent circuit diagram of the complex high frequency components in the first embodiment.

The complex high frequency components 1*a*, 1*b* do not have to have the coupling capacitor 25; FIG. 3 shows an equivalent circuit of such complex high frequency components 1*a*, 1*b* without the coupling capacitor 25. As apparent from FIG. 3 the other end of the first transmission line 20 is open in the absence of the coupling capacitor 25.

Figure 4:
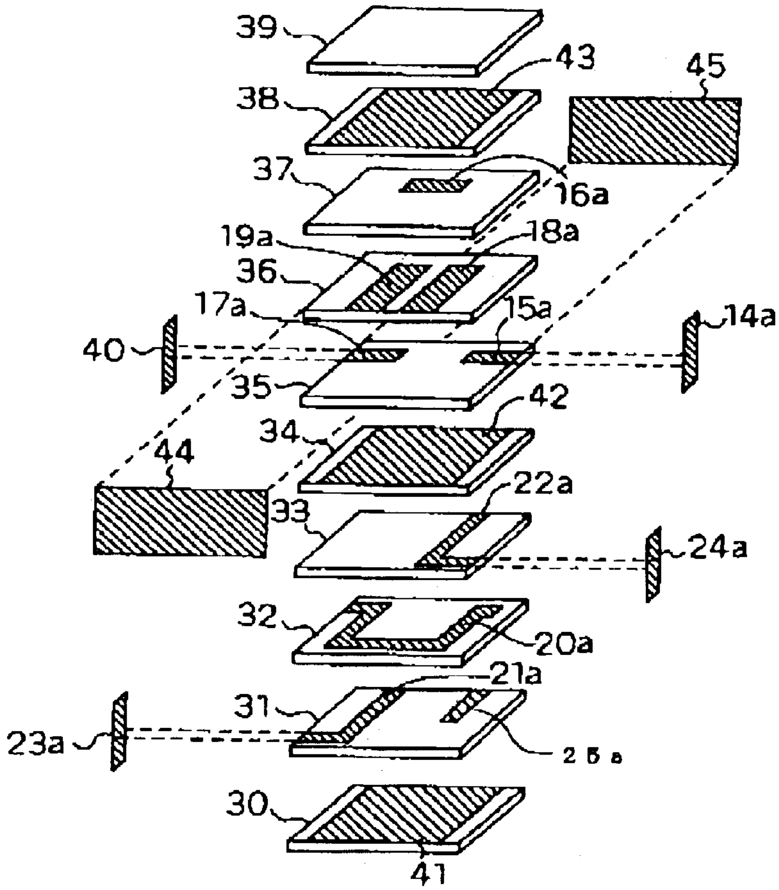
FIG. 4 is an exploded perspective view showing a structure of the complex high frequency components in the first embodiment.

FIG. 4 shows an exploded perspective view of the complex high frequency components 1*a*, 1*b*. As shown in FIG. 4 the complex high frequency components 1*a*, 1*b* comprise dielectric layers 30–39 and electrode layers 15*a*–22*a*, 25*a*, and 41–43 sequentially arranged and stacked. The dielectric layers 30–39 have a rectangular shape of 3.2 mm×2.5 mm×1.3 mm and are made from a Bi—Ca—Nb—O series material with a relative permittivity $\in_r$ of 58. The electrode layers 15*a*–22*a*, 25*a*, 41–43 are made from a material mainly containing silver or copper, and are formed on the dielectric layers 30–39 by printing or other methods.

The multilayered structure composed of the dielectric layers 30–39 is a cube, and edge electrodes 44, 45, 14*a*, 23*a*, 24*a*, and 40 are formed on the sides of this cube.

The multilayered structure has a pair of opposed sides. The edge electrodes 44, 45 are arranged respectively on a first pair of opposed sides, and are connected to an unillustrated grounding terminal. The edge electrodes 14*a*, 23*a*, 24*a*, and 40 are arranged on the second pair of opposed sides. To be more specific, the edge electrodes 14*a*, 24*a* are arranged on one side of the second pair of the opposed sides, whereas the edge electrodes 23*a*, 40 are arranged on the other side of the second pair of opposed sides.

First, second, and third shield electrode layers 41, 42, and 43 are formed on the top surfaces of the dielectric layers 30, 34, and 38, respectively, and are connected to the edge electrodes 44, 45.

A second transmission line electrode layer 21*a* and a coupling capacitor electrode layer 25*a* are formed on the top surface of the dielectric layer 31. The second transmission line electrode layer 21*a* is connected at one end to the edge electrode 23*a*, and is also connected at the other end to the edge electrode 45. The coupling capacitor electrode layer 25*a* is connected to the edge electrode 45.

A first transmission line electrode layer 20*a* is formed on the top surface of the dielectric layer 32, and is connected at one end to the edge electrode 40 and is open at the other end.

A third transmission line electrode layer 22*a* is formed on the top surface of the dielectric layer 33, and is connected at one end to the edge electrode 24*a* and is connected at the other end to the edge electrode 45.

The input/output coupling capacitor electrode layers 15*a*, 17*a* are formed on the top surface of the dielectric layer 35.

The input/output coupling capacitor electrode layer 15*a* is connected at one end to the edge electrode 14*a*. The input/output coupling capacitor electrode layer 17*a* is connected at one end to the edge electrode 40.

Resonator electrode layers 18*a*, 19*a* are formed on the top surface of the dielectric layer 36, and are connected at one end to the edge electrode 44.

An inter-stage coupling capacitor electrode layer 16*a* is formed on the top surface of the dielectric layer 37.

Next, operations of the complex high frequency components 1*a*, 1*b* will be described as follows.

The dielectric layers 35–37 area functions as the filter 3*a* or 3*b* shown in FIG. 1, that is, the edge electrode 14*a* functions as the unbalanced terminal 14. The input/output coupling capacitor electrode layer 15*a* connected to the edge electrode 14*a* functions as one of the capacity electrodes of the input/output coupling capacitor 15. The input/output coupling capacitor electrode layer 15*a* and the resonator electrode layer 18*a* are mutually capacitor coupled to form the input/output coupling capacitor 15.

The resonator electrode layers 18*a* and 19*a* function as the resonators 18 and 19, respectively, and are arranged close to each other on the dielectric layer 36. Consequently, the resonator electrode layers 18*a*, 19*a* are electromagnetically coupled with each other.

The inter-stage coupling capacitor electrode layer 16*a* is capacitor coupled with each of the resonator electrode layers 18*a* and 19*a* to form the inter-stage coupling capacitor 16. The input/output coupling capacitor electrode layer 17*a* is capacitor coupled with the resonator electrode layer 19*a* to form the input/output coupling capacitor 17.

In this manner, the dielectric layers 35–37 area functions as a two-stage band pass filter.

The dielectric layers 31–33 area functions as the baluns 2*a*, 2*b* of FIG. 1. To be more specific, the first to third transmission line electrode layers 20*a*, 21*a*, and 22*a* function as the first-third transmission lines 20, 21, and 22, respectively.

The edge electrode 23*a* connected to one end of the second transmission line electrode layer 21*a* functions as one balanced terminal 23. The edge electrode 24*a* connected to one end of the third transmission line electrode layer 22*a* functions as the other balanced terminal 24. The coupling capacitor electrode layer 25*a* is capacitor coupled with the other end of the first transmission line electrode layer 20*a*. As the result, the coupling capacitor 25 is formed. The second and third transmission line electrode layers 21*a* and 22*a* are electromagnetically coupled with the first transmission line electrode layer 20*a*.

The second transmission line electrode layer 21*a* is formed on the dielectric layer 31, and the third transmission line electrode layer 22*a* is formed on the dielectric layer 33. The formation of the second and third transmission line electrode layers 21*a*, 22*a* on the different dielectric layers 31, 33 provides the following advantage; it becomes possible to suppress unnecessary electromagnetic coupling between the second and third transmission line electrode layers 21*a*, 22*a*. As a result, the baluns 2*a*, 2*b* are prevented from property deterioration due to the unnecessary electromagnetic coupling.

In addition, the presence of the coupling capacitor electrode layer 25A can provide one more capacitor whose capacitor value can be changed as desired. For the addition of the capacitor with this function, the complex high frequency components 1*a*, 1*b* can have increased design flexibility.

The resonator electrode layers 18*a*, 19*a* which are the main components of the baluns 2*a*, 2*b* are disposed separately, with the dielectric layers 34, 35 therebetween, from the first-third transmission line electrode layers 20*a*–22*a* which are the main components of the filters 3*a*, 3*b*. This arrangement suppresses unnecessary electromagnetic coupling between the baluns 2*a*, 2*b*and the filters 3*a*, 3*b*, thereby preventing the baluns 2*a*, 2*b*and the filters 3*a*, 3*b* from property degradation due to the unnecessary electromagnetic coupling. The effect of suppressing the unnecessary electromagnetic coupling becomes further effective by the provision of the shield electrode layer 42 on the dielectric layer 34.

The edge electrode 40 connects the filters 3*a*, 3*b* with the baluns 2*a*, 2*b* by connecting the input/output coupling capacitor electrode layer 17*a* and the first transmission line electrode layer 20*a*. In this manner, the filters 3*a*, 3*b* and the baluns 2*a*, 2*b* are connected to each other by the connection composer, the edge electrode 40, which can be formed comparatively easily.

The dielectric layers 35–37 area is sandwiched between the third shield electrode layer 43 of the dielectric layer 38 and the second shield electrode layer 42 of the dielectric layer 34.

The dielectric layers 31–33 area is sandwiched between the second shield electrode layer 42 of the dielectric layer 34 and the first shield electrode layer 41 of the dielectric layer 30.

The complex high frequency components 1*a*, 1*b* have the following advantage because the dielectric layers are sandwiched between the shield electrode layers; the complex high frequency components 1*a*, 1*b* can be free from external noise influence and electromagnetic coupling between the filters 3*a*, 3*b* and the baluns 2*a*, 2*b*. Consequently, the properties of the complex high frequency components 1*a*, 1*b* can be maintained without deterioration.

The complex high frequency components 1*a*, 1*b* are produced by stacking the dielectric layers 30–39 and sintering together. As a result, the complex high frequency components 1*a*, 1*b* have a multilayered integral structure, thereby being downsized as compared with the case where the baluns and the filters are mounted on different circuit substrates.

Since the complex high frequency components 1*a*, 1*b* have the baluns 2*a*, 2*b* and the filters 3*a*, 3*b* thus integrated, the number of components in the wireless circuit can be reduced. Mounting the complex high frequency components 1*a*, 1*b* with these features on the communication device 4 can achieve miniaturization and cost reduction. Furthermore, the reduction in the number of components can increase the efficiency of producing operation of the communication device 4.

Since the complex high frequency components 1*a*, 1*b* have the baluns 2*a*, 2*b* and the filters 3*a*, 3*b* which are integrated, the impedances between the baluns 2*a*, 2*b* and the filters 3*a*, 3*b* can be easily matched. To be more specific, the impedances can be easily matched by arbitrarily setting (differently from each other) the dielectric constant of the baluns 2*a*, 2*b* area in the dielectric layers 30–39 and the dielectric constant of the filters 3*a*, 3*b* area in the dielectric layers 30–39.

This eliminates the use of a matching element to match the impedances, thereby further decreasing the number of components. Consequently, the complex high frequency components 1*a*, 1*b* can be further downsized.

In the complex high frequency components 1*a*, 1*b*, the dielectric layers 30–39 are used as the components of the capacitors which compose the baluns 2*a*, 2*b* and the filters 3*a*, 3*b*. This eliminates the need of the preparation of dielectric members to be the components of the capacitors and integrating them into the dielectric layers 30–39. For this, the complex high frequency components 1*a*, 1*b* can be downsized.

In the complex high frequency components 1*a*, 1*b*, a connection between the dielectric layers 30–39 and a connection between the baluns 2*a*, 2*b* and the filters 3*a*, 3*b* are done by the edge electrodes 14*a*, 23*a*, 24*a*, 40, 44, and 45 formed on the sides of the multilayered structure composed of the dielectric layers 30–39. Since the edge electrodes are connection composers to be formed comparatively easily, the structure required for the connections can be simplified, thereby reducing the production cost in the complex high frequency components 1*a*, 1*b* where the connections are performed by the edge electrodes.

The electric properties of the baluns 2*a*, 2*b* and the filters 3*a*, 3*b* can be easily adjusted by trimming the edge electrodes 14*a*, 23*a*, 24*a*, 40, and the like.

The adjustment of the electric properties of the filters 3*a*, 3*b* in the complex high frequency components 1*a*, 1*b* are further facilitated as follows.

When mounted on a circuit substrate, the complex high frequency components 1*a*, 1*b* can be mounted while the dielectric layer 30 is arranged to face the circuit substrate. In this arrangement, the filters 3*a*, 3*b* are disposed at the farthest position from the circuit substrate, which minimizes the influence of other electric elements on the filters 3*a*, 3*b*. Under these conditions, trimming can be applied to the edge electrodes 14*a*, 23*a*, 24*a*, and 40, the third shield electrode layer 43 and the like to further facilitate the adjustment of the electric properties of the filters 3*a*, 3*b*.

The complex high frequency components of the present invention can be integrated not only into the communication device 4 as a cellular phone terminal but also into an automobile phone terminal, a PHS terminal, and a wireless base station for these terminals. In short, the present invention can be executed in any communication device having baluns and filters in a part of its circuit structure.

The dielectric layers 30–39 composing the complex high frequency components 1*a*, 1*b* could be different in size and material from the one described in the present embodiment . In other words, similar effects to those in the above embodiment could be obtained when the dielectric layers 30–39 are formed from a material having a different relative permittivity $\in_r$ from the one in the above embodiment. In addition, the dielectric layers 30–39 can be different in size from those described in the above embodiment. The present invention does not require that all the dielectric layers 30–39 be made from the same material; it is possible that at least two of the layers are different from each other in the relative permittivity $\in_r$. The complex high frequency components 1*a*, 1*b* having the dielectric layers 30–39 different in the relative permittivity $\in_r$ can be produced by heterogeneous lamination technique.

Figure 5:
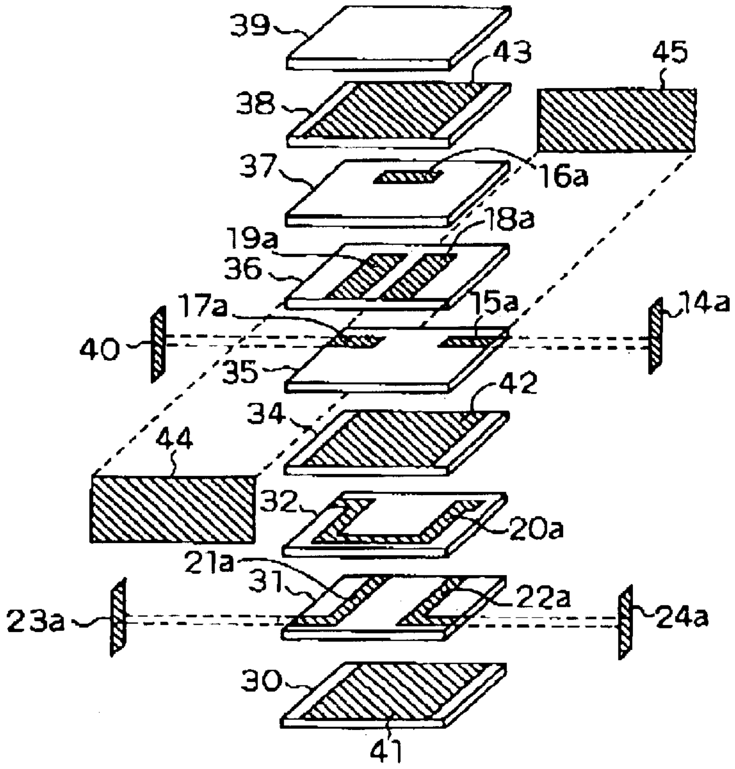
FIG. 5 is an exploded perspective view showing another structure of the complex high frequency components in the first embodiment.
Figure 6:
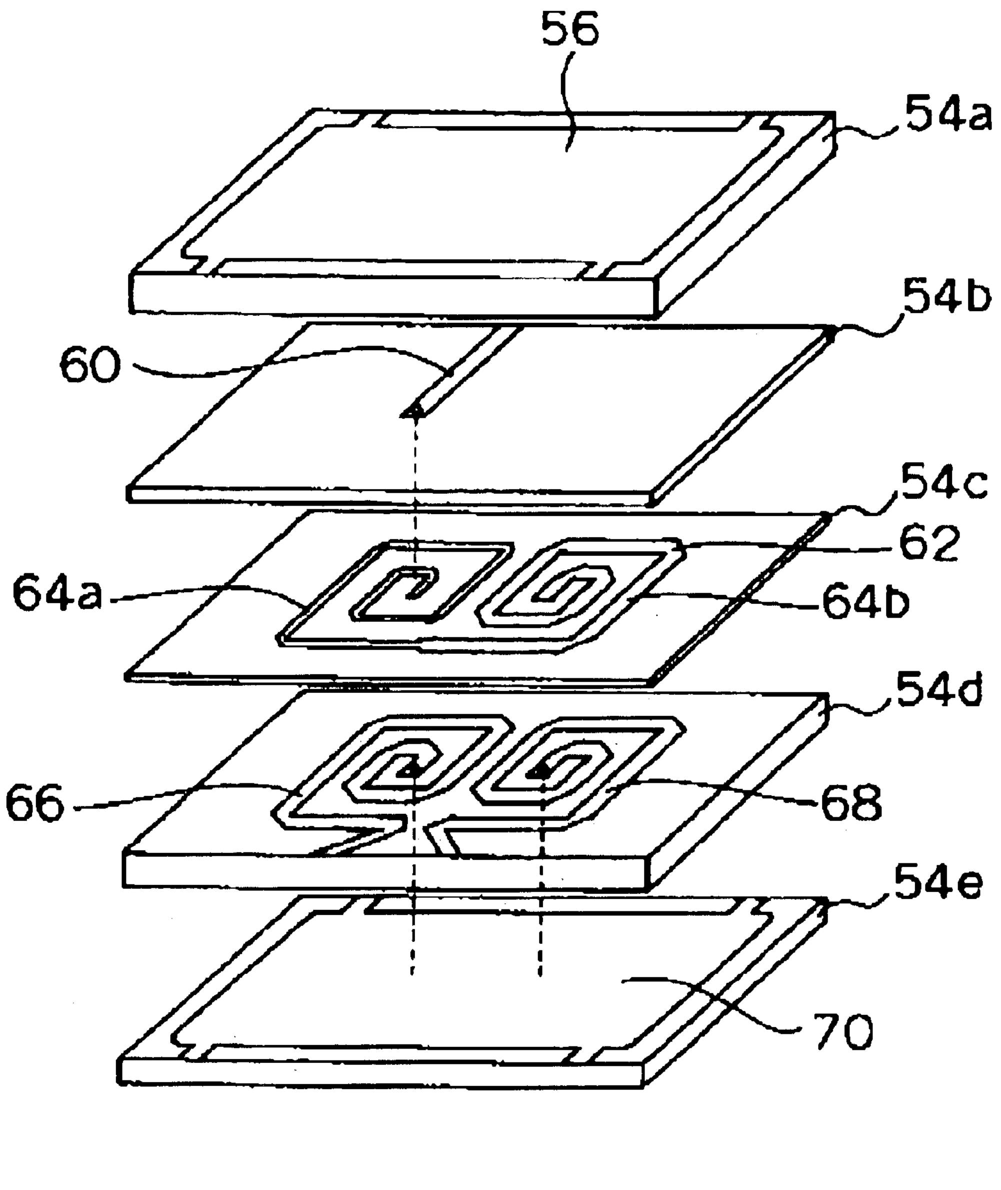
FIG. 6 is an exploded perspective view showing further another structure of the complex high frequency components in the first embodiment.

As shown in FIG. 5 the second transmission line electrode layer 21*a* and the third transmission line electrode layer 22*a* can be disposed on the dielectric layer 31 in the absence of the dielectric layer 33. In contrast, as shown in FIG. 6 the second transmission line electrode layer 21*a* and the third transmission line electrode layer 22*a* can be disposed on the dielectric layer 33 in the absence of the dielectric layer 31.

When the second and third transmission line electrode layers 21*a*, 22*a* are formed on the same dielectric layer, the number of the dielectric layers which compose the complex high frequency components 1*a*, 1*b* can be reduced though the properties of the baluns 2*a*, 2*b* are slightly deteriorated due to the electromagnetic coupling between the second and third transmission line electrode layers 21*a*, 22*a*. This facilitates a reduction in the production cost and size of the complex high frequency components 1*a*, 1*b*.

The complex high frequency components 1*a*, 1*b* further have the following advantage in mounting; the complex high frequency components 1*a*, 1*b* of the present embodiment can be mounted on the circuit substrate A while the filters 3*a*, 3*b* are made to face the circuit substrate A as shown in FIG. 4. To be more specific, the outer surface of the dielectric layer 30 can be a mounting side with respect to the circuit substrate A.

In this arrangement, the grounding conditions can be strengthened. In this case, the second and third transmission lines electrode layers 21*a* and 22*a* can be formed either on the same dielectric layer or on different dielectric layers from each other.

In contrast, the complex high frequency components 1*a*, 1*b* can be mounted on the circuit substrate A while the baluns 2*a*, 2*b* are made to face the circuit substrate A. To be more specific, the outer surface of the dielectric layer 39 can be a mounting side with respect to the circuit substrate A.

Figure 7:
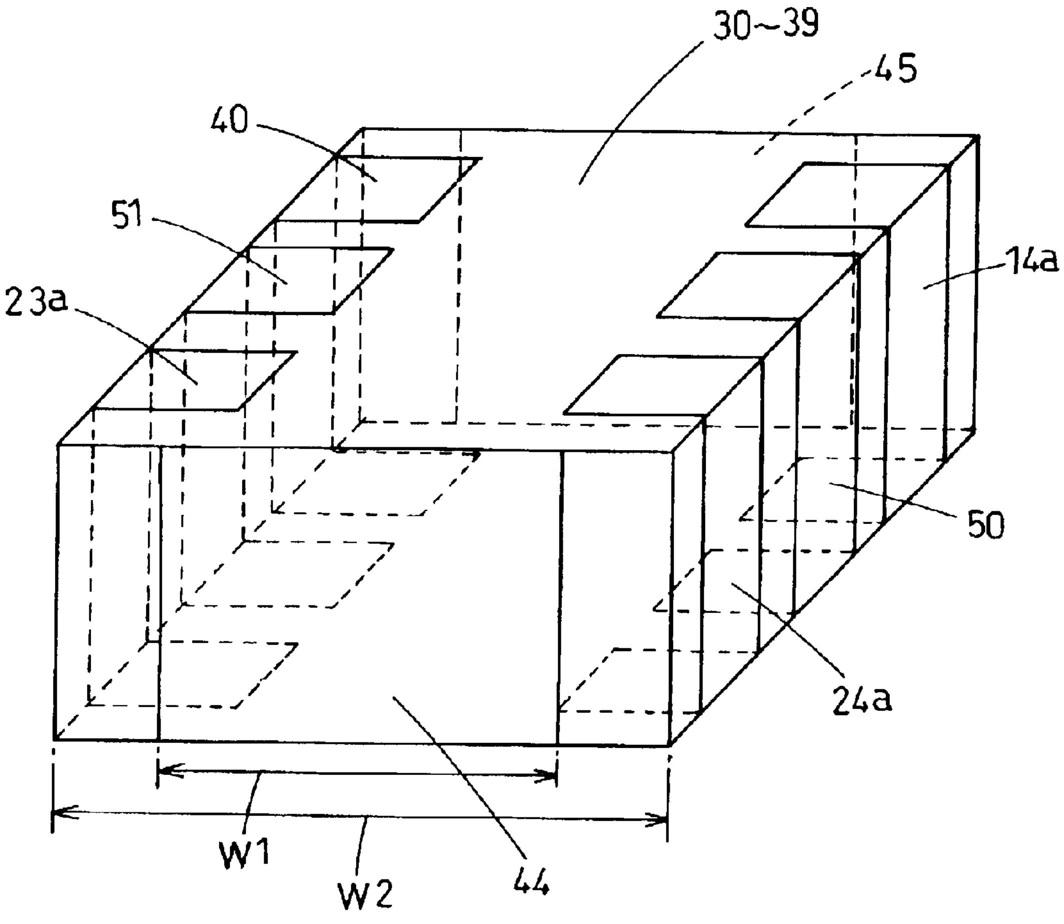
FIG. 7 is a perspective view showing an example of the outer appearance of the complex high frequency components in the first embodiment.

As shown in FIG. 7, shield electrodes 50, 51 can be provided on sides of the multilayered structure composed of the dielectric layers 30–39. In this case, the shield electrode 50 is disposed on the side where the edge electrodes 14*a*, 24*a* are formed, whereas the shield electrode 51 is disposed on the side where the edge electrodes 23*a*, 40 are formed. In addition, the shield electrodes 50, 51 are disposed between the edge electrodes (14*a*, 24*a*) which are on the same side and between the edge electrodes (23*a*, 40) which are on the same side, respectively.

Of these two sets of edge electrodes (14*a*, 24*a*) and (23*a*, 40) each formed on the same side, one set is connected to the baluns 2*a*, 2*b* and the other set is connected to the filters 3*a*, 3*b*. Therefore, it is preferable to provide electrical separation between the edge electrodes (14*a*, 24*a*) disposed on the same side and between the edge electrodes (23*a*, 40) disposed on the same side in order to improve the properties of the complex high frequency components 1*a*, 1*b*.

In the structure shown in FIG. 7 where the shield electrodes 50, 51 are provided between the edge electrodes (14*a*, 24*a*) formed on the same side and between the edge electrodes (23*a*, 40) formed on the same side, respectively. This arrangement secures the electric separation between the edge electrodes (14*a*, 24*a*) and between the edge electrodes (23*a*, 40), thereby improving the properties of the complex high frequency components 1*a*, 1*b*.

In the structure shown in FIG. 7 the width w1 of the edge electrodes 44, 45 is smaller than the width w2 of the side of the multilayered structure (w1<w2). This can reduce the volume of the connecting member (solder, conductive adhesive agent, or the like) to be in contact with the edge electrodes 44, 45 in mounting. As a result, the area required to mount one complex high frequency component on the circuit substrate A can be reduced, thereby downsizing the mounting structure of the complex high frequency components 1*a*, 1*b*.

Setting at w2<w2 has another advantage as follows. In the structure of the complex high frequency components 1*a*, 1*b* shown in FIG. 7, the edge electrodes 23*a*, 24*a* are sometimes drawn outwardly towards the edge electrode 44. Such a drawing electrode pattern is provided on the substrate where the complex high frequency components 1*a*, 1*b* are mounted.

If the edge electrode 44 is formed throughout the length of the side of the multilayered structure, the drawing electrode pattern must once sidestep both ends of the edge electrode 44 and then be drawn towards the edge electrode 44. However, this pattern structure makes the drawing electrode pattern length larger for the provision of the sidestepping pattern.

In contrast, in the structure shown in FIG. 7, the edge electrode 44 is formed on the side of the multilayered structure excluding both ends of the side. This structure enables the drawing electrode pattern to pass through both ends of the side having no edge electrode 44 thereon. As a result, the drawing electrode pattern can be drawn straight towards the edge electrode 44 without sidestepping both ends of the edge electrode 44. In this pattern structure, the drawing electrode pattern length can be smaller because the sidestepping pattern becomes unnecessary.

In FIG. 7, one of the baluns 2*a*, 2*b* and the filters 3*a*, 3*b* can be connected to the edge electrodes 14*a*, 24*a*, and the other can be connected to the edge electrodes 23*a*, 40. By doing so, the input/output terminals of the baluns 2*a*, 2*b* and the input/output terminals of the filters 3*a*, 3*b* can be separately arranged on the opposing sides of the multilayered structure. This secures the electric separation between the baluns 2*a*, 2*b* and the filters 3*a*, 3*b*, thereby improving the properties of the complex high frequency components.

It is also possible to provide connection between the dielectric layers 30–39 by using via electrodes, which are formed as follows. A through hole is formed in any of the dielectric layers 30–39, and is filled with a conductive paste mainly composed of silver or copper. After this, the dielectric layers 30–39 are integrally sintered to form these via electrodes.

In general, forming via electrodes costs less than forming edge electrodes. Therefore via electrodes can be used to connect any of the dielectric layers 30–39, thereby reducing the production cost.

The filters 3*a*, 3*b* could be notch filters, low pass filters, or high pass filters to have the same effects.

The complex high frequency components 1*a*, 1*b* can be composed of another number of dielectric layers depending on the circuit structure.

In the complex high frequency components 1*a*, 1*b*, the dielectric layers 30–39 do not have to be integrally sintered as long as baluns and filters are integrally mounted on the same circuit substrate, instead of being mounted separately on different circuit substrates.

As described hereinbefore, in the present embodiment a wireless circuit using baluns and filters and a communication device such as a cellular phone terminal using the wireless circuit can be further miniaturized.

(Second Embodiment)

Figure 8:
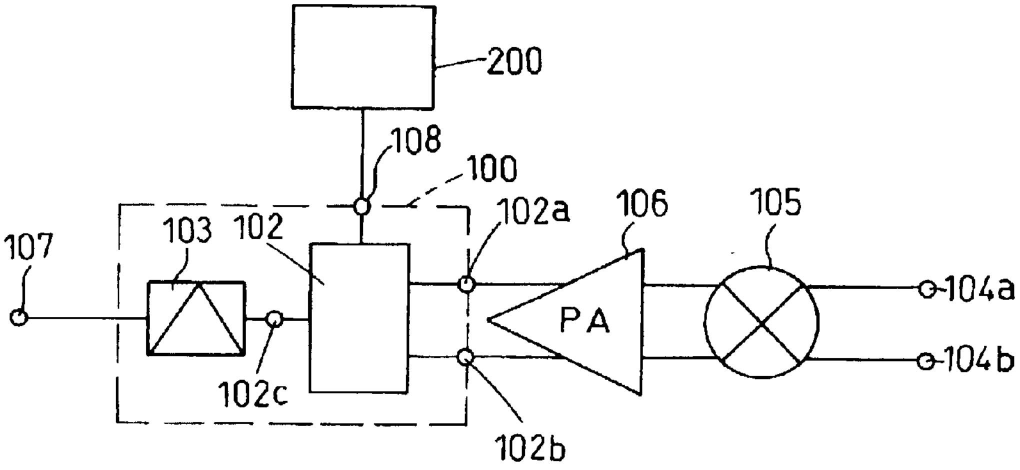
FIG. 8 is a block diagram showing the structure of the transmitter-side wireless circuit unit in the communication device of the second embodiment of the present invention.

FIG. 8 shows the transmitter-side wireless circuit unit of a communication device using the complex high frequency component 100 of the second embodiment of the present invention. The communication device in the present embodiment is a cellular phone terminal, and FIG. 8 shows a block diagram of the transmitter-side wireless circuit unit.

The transmitter-side wireless circuit unit of the present embodiment is composed of the complex high frequency component 100, input terminals 104*a*, 104*b*, a frequency converter 105, a power amplifier 106, an output terminal 107, and an auxiliary connection terminal 108.

The complex high frequency component 100 is composed of a balun 102 and a filter 103, which are integrally stacked. The balun 102 includes second and third connection terminals 102*a*, 102*b*, and a first connection terminal 102*c*. The balun 102 converts signals with the transmitting frequencies outputted as balanced line signals from the power amplifier 106 into unbalanced line signals. The signals with the transmitting frequencies which are balanced line signals are entered to the balun 102 through the second and third connection terminals 102*a*, 102*b*. The output of the balun 102, which is unbalanced line signals, is outputted from the first connection terminal 102*c*.

The filter 103 reduces unnecessary frequency bands out of the signals converted into unbalanced line signals at the balun 102. The frequency converter 105 frequency-converts modulated signals into transmitting signals. The power amplifier 106 amplifies transmitting signals. Although they are not illustrated in FIG. 8, all units between the input terminals 104*a*, 104*b* and the output terminal 107 are connected via matching circuit elements such as a capacitor or an inductor.

Next, operations of the transmitter-side wireless circuit unit of the present embodiment thus structured will be described as follows.

The frequency converter 105 mixes the modulation signals entered through the input terminals 104*a*, 104*b* with carrier wave signals entered from an unillustrated oscillator, thereby frequency-converting the modulation signals into transmitting signals. The power amplifier 106 amplifies signals outputted from the frequency converter 105 and outputs them as transmitting signals. The frequency converter 105 and the power amplifier 106 function as a balanced circuit. Therefore, the signals with transmitting frequencies outputted from the power amplifier 106 become balanced line signals.

The balun 102 converts the transmitting signals outputted from the power amplifier 106 into unbalanced line signals. The filter 103, which reduces the unnecessary frequency bands of the transmitting signals, outputs transmitting signals to an illustrated antenna or antenna switch via the output terminal 107. The filter 103 functions as an unbalanced circuit.

The auxiliary connection terminal 108 of the complex high frequency component 100 is connected with the power amplifier 106, which is powered from a power supply unit 200 via the auxiliary connection terminal 108, the balun 2, and a signal line connecting the balun 102 and the power amplifier 106.

Next, the complex high frequency component 100 composing a part of the transmitter-side wireless circuit unit will be described as follows.

Figure 9:
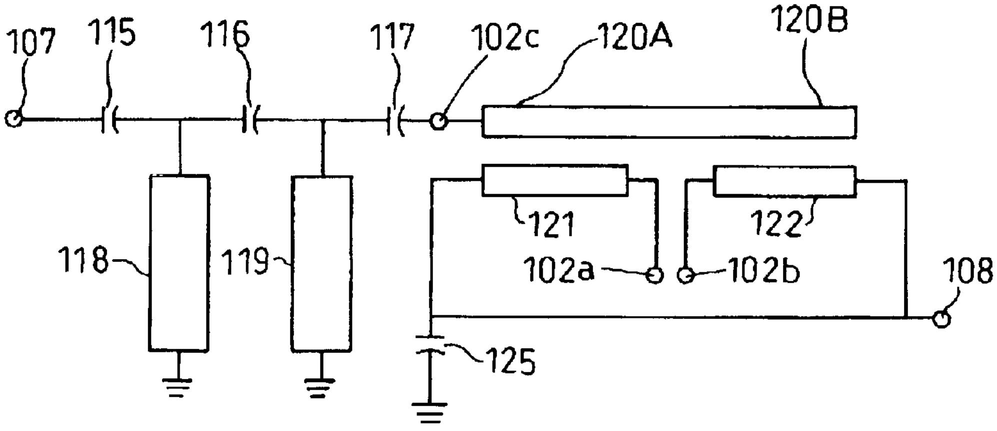
FIG. 9 is an equivalent circuit diagram showing the internal circuit structure of the second embodiment.

FIG. 9 shows the internal circuit structure of the complex high frequency component 100.

In the circuit shown in FIG. 9 the filter 103 is composed of the output terminal 107 which is an unbalanced terminal, input/output coupling capacitors 115, 117, an inter-stage coupling capacitor 116, and resonators 118, 119.

The balun 102 is composed of a first transmission line 120A, a second transmission line 121, a third transmission line 120B, a fourth transmission line 122, the second and third connection terminals 102*a*, 102*b* as balanced terminals, the first connection terminal 102*c* which is an unbalanced terminal, a grounding capacitor 125, and the auxiliary connection terminal 108. The first transmission line 120A and the third transmission line 120B are mutually coupled to form one transmission line. The first transmission line 120A and the second transmission line 121 compose a pair of transmission lines electromagnetically coupled with each other. The third transmission line 120B and the fourth transmission line 122 compose a pair of transmission lines electromagnetically coupled with each other.

The output terminal 107 is connected to one of the capacitor electrodes of the input/output coupling capacitor 115. The other capacitor electrode of the input/output coupling capacitor 115 is connected to one of the capacitor electrodes of the inter-stage coupling capacitor 116. The other capacitor electrode of the inter-stage coupling capacitor 116 is connected to one of the capacitor electrodes of the input/output coupling capacitor 117. In this manner, the input/output coupling capacitor 115, the inter-stage coupling capacitor 116, and the input/output coupling capacitor 117 are connected in series to the output terminal 107 in that order.

The resonator 118 is connected to the other capacitor electrode of the input/output coupling capacitor 115 and one of the capacitor electrodes of the inter-stage coupling capacitor 116. The resonator 119 is connected to the other capacitor electrode of the inter-stage coupling capacitor 116 and one of the capacitor electrodes of the input/output coupling capacitor 117. The other capacitor electrode of the input/output coupling capacitor 117 is connected to the first connection terminal 102*c* of the balun 102.

The first connection terminal 102*c* is also connected to one end of the first transmission line 120A. The other end of the first transmission line 102A and one end of the third transmission line 120B are joined to each other. The other end of the third transmission line 120B is open. The second transmission line 121 is connected at one end to the second connection terminal 102*a* of the balun 102 and is grounded at the other end via the grounding capacitor 125 and is further connected to the auxiliary connection terminal 108. The fourth transmission line 122 is connected at one end to the third connection terminal 102*b* of the balun 102, and is grounded at the other end via the capacitor 125 and is further connected to the auxiliary connection terminal 108.

Figure 10:
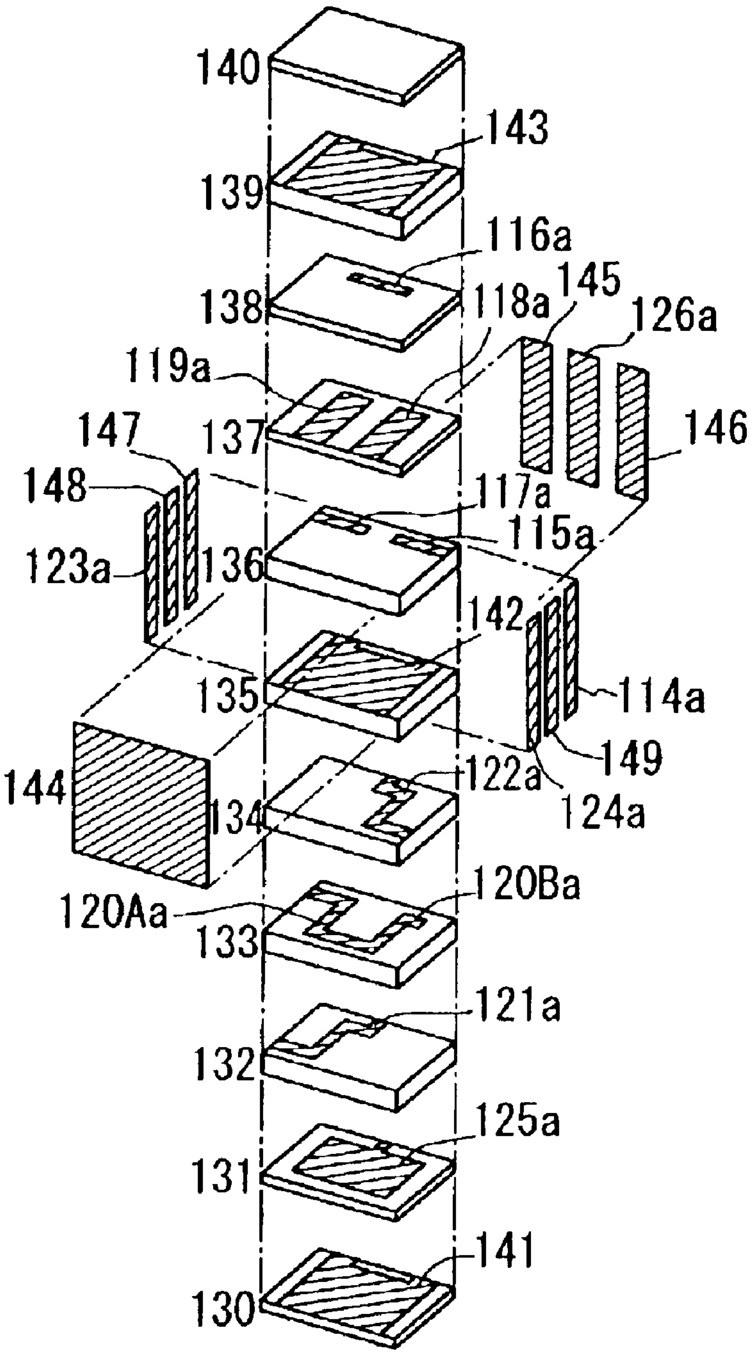
FIG. 10 is an exploded perspective view showing a structure of the complex high frequency components in the second embodiment.

FIG. 10 shows an exploded perspective view of the complex high frequency component 100, which comprises dielectric layers 130–140 and electrode layers 120A*a*, 120B*a* . . . sequentially arranged and stacked. The dielectric layers 130–140 have a rectangular shape of 3.2 mm×2.5 mm×1.3 mm and are made from a Bi—Ca—Nb—O series material with a relative permittivity $\in_r$ of 58. The electrode layers 120A*a*, 120B*a* . . . are made from a material mainly containing silver or copper, and are formed on the dielectric layers 130–140 by printing or other methods.

The multilayered structure composed of the dielectric layers 130–140 is a cube, and edge electrodes 144–149, 114*a*, 123*a*, 124*a*, and 126*a* are formed on the sides of this cube.

The multilayered structure has a pair of opposed sides. The edge electrodes 144–146 are arranged on a first pair of opposed sides. To be more specific, the edge electrode 144 is disposed on one side of the first pair of opposed sides, whereas the edge electrodes 145, 146 are disposed on the other side of the first pair of opposed sides. The edge electrodes 144–146 are connected to an unillustrated grounding terminal.

The edge electrodes 147–149, on the other hand, are arranged on the second pair of opposed sides. To be more specific, the edge electrodes 147, 148 are arranged on one side of the second pair of opposed sides, whereas the edge electrode 149 is arranged on the other side of the second pair of opposed sides.

The edge electrodes 114*a*, 124*a* are formed on the other side (where the edge electrode 149 is formed) of the second pair of opposed sides. The edge electrode 123*a* is formed on one side (where the edge electrodes 147, 148 are formed) of the second pair of opposed sides. The edge electrode 126*a* is formed on the other side (where the edge electrodes 145, 146 are formed) of the first pair of opposed sides.

First, second, and third shield electrode layers 141, 142, 143 are formed on the top surfaces of the dielectric layers 130, 135, and 139, respectively, and are connected to the edge electrodes 144, 145, and 146, respectively.

A coupling capacitor electrode layer 125*a* is formed on the top surface of the dielectric layer 131 and is connected to the edge electrode 126*a*.

A second transmission line electrode layer 121*a* is formed on the top surface of the dielectric layer 132 and is connected at one end to the edge electrode 123*a*, and is also connected at the other end to the edge electrode 126*a*.

The first and third transmission line electrode layers 120A*a*, 120B*a* are formed on the top surface of the dielectric layer 133. The first transmission line electrode layers 120A*a* is connected at one end to the edge electrode 147, and is coupled at the other end with one end of the third transmission line electrode layer 120B*a*. The other end of the third transmission line electrode layer 120B*a* is open.

A fourth transmission line electrode layer 122*a* is formed on the top surface of the dielectric layer 134, and is connected at one end to the edge electrode 124a and is connected at the other end to the edge electrode 126a. The edge electrode 126a is connected to the auxiliary connection terminal 108 which is not illustrated in FIG. 10.

Input/output coupling capacitor electrode layers 115a, 117a are formed on the top surface of the dielectric layer 136. One end of the input/output coupling capacitor electrode layer 115a is connected to the edge electrode 114a, and one end of the input/output coupling capacitor electrode layer 117a is connected to the edge electrode 147.

Resonator electrode layers 118a, 119a composed of electrode patterns are formed on the top surface of the dielectric layer 137. One end of each of the resonator electrode layers 118a, 119a is connected to the edge electrode 144.

An inter-stage coupling capacitor electrode layer 116a is formed on the top surface of the dielectric layer 138.

The following is a description of the operations of the complex high frequency component 100.

The dielectric layers 136–138 area functions as the filter 103, that is, the edge electrode 114a functions as the output terminal 107, which is an unbalanced terminal. The input/output coupling capacitor electrode layer 115a connected to the edge electrode 114a functions as one of the capacity electrodes of the input/output coupling capacitor 115. The input/output coupling capacitor electrode layer 115a and the resonator electrode layer 118a are mutually capacitor coupled with the dielectric layer 137 disposed therebetween so as to function as the input/output coupling capacitor 115.

The resonator electrode layers 118a and 119a function as the resonators 118 and 119, respectively, and are arranged close to each other on the dielectric layer 137. Consequently, the resonator electrode layers 118a, 119a are electromagnetically coupled with each other.

The inter-stage coupling capacitor electrode layer 116a is capacitor coupled with each of the resonator electrode layers 118a, 119a to form the inter-stage coupling capacitor 116. The input/output coupling capacitor electrode layer 117a is capacitor coupled with the resonator electrode layer 119a to form the input/output coupling capacitor 117.

In this manner, the dielectric layers 135–137 area functions as a two-stage band pass filter.

The dielectric layers 131–134 area functions as the balun 102. To be more specific, the edge electrode 123a is connected to the second transmission line electrode layer 121a and functions as the second connection terminal 102a, which is a balanced terminal. The edge electrode 124a is connected to the fourth transmission line electrode layer 122a and functions as the third connection terminal 102b, which is a balanced terminal.

The second transmission line electrode layer 121a is electromagnetically coupled with the first transmission line electrode layer 120Aa. The fourth transmission line electrode layer 122a is electromagnetically coupled with the third transmission line electrode layer 120Ba.

The coupling capacitor electrode layer 125a and the first shield electrode layer 141 are capacitor coupled via the dielectric layer 131, and consequently the grounding capacitor 125 is formed. The edge electrode 126a functions as the auxiliary connection terminal 108.

The electric current elements supplied from the edge electrode 126a, which is the auxiliary connection terminal 108, pass through the second transmission line electrode layer 121a and the fourth transmission line electrode layer 122a. Consequently, the second and fourth transmission line electrode layers 121a, 122a function as choke inductors for the electric current components. This eliminates the need for an external inductor.

Figure 11A:
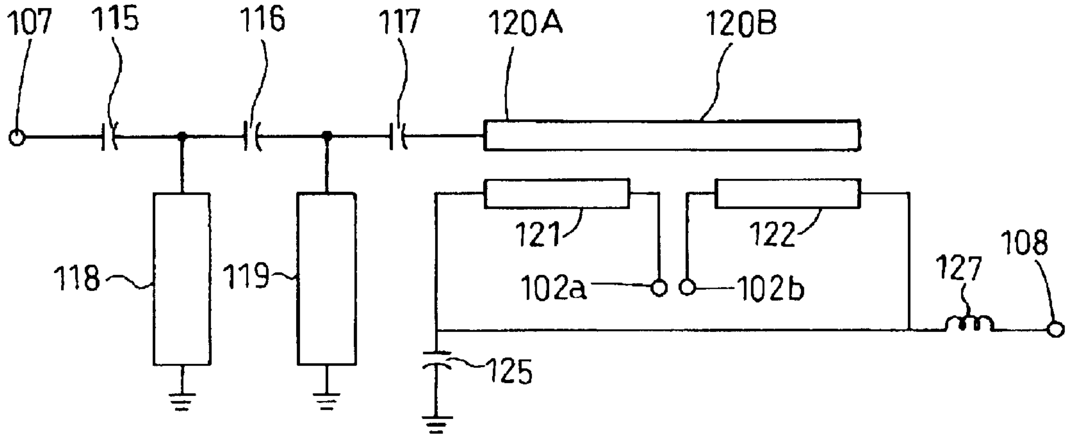
FIG. 11A is an equivalent circuit diagram showing another structure of the complex high frequency components in the second embodiment.

When the second and fourth transmission lines 121, 122 lack choke inductor elements, an inductor 127 can be disposed between the second and fourth transmission lines 121, 122 and the auxiliary connection terminal 108 as shown in FIG. 11A. This enables the second and fourth transmission lines 121, 122 to have smaller values than are inherently required, thereby providing an advantage to miniaturization.

In the structure shown in FIG. 10, the coupling capacitor electrode layer 125a is connected to the edge electrode 126a, and is further connected to the second and fourth transmission line electrode layers 121a, 122a via the edge electrode 126a. As a result, the second and fourth transmission line electrode layers 121a, 122a are grounded via the grounding capacitor 125. This can prevent the electric current supplied from the edge electrode 126a which functions as the auxiliary connection terminal 108 from flowing to the grounding potential. This allows the balun 102 to be used as the power supply track for the active element (the power amplifier 106 or the like) connected to the second and third connection terminals 102a, 102b. As another advantage, containing the grounding capacitor 125 inside the multilayered structure can prevent an increase in the number of components.

Figure 11B:
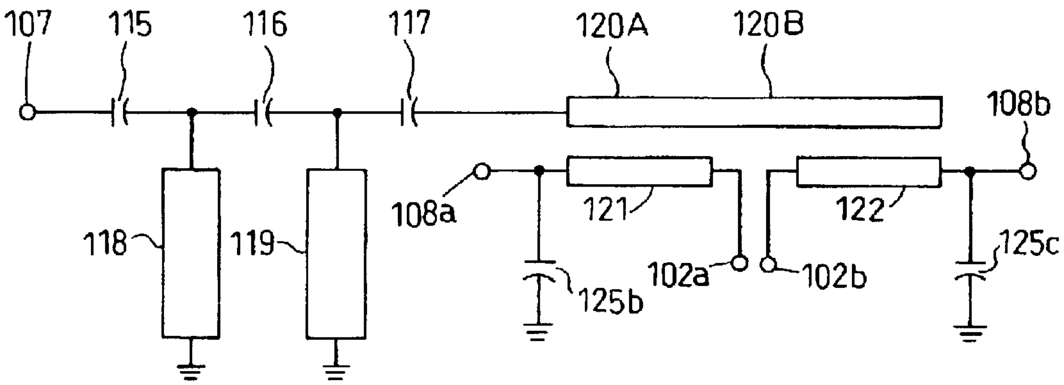
FIG. 11B is an equivalent circuit diagram showing another structure of the complex high frequency components in the second embodiment.

In the internal circuit structure of the complex high frequency component 100 shown in FIG. 9, the second and fourth transmission lines 121 and 122 are both connected to the single grounding capacitor 125; however, the present invention is not restricted to this structure, and the second and fourth transmission lines 121 and 122 could be connected to two different coupling capacitors, and be grounded. To be more specific, as shown in FIG. 11B, the second transmission line 121 is grounded via a first grounding capacitor 125b, and is also connected to an auxiliary connection terminal 108a, whereas the fourth transmission line 122 is grounded via a second grounding capacitor 125c, and is also connected to an auxiliary connection terminal 108b. In this structure, the second and fourth transmission lines 121 and 122 are provided with the respective grounding capacitors 125b, 125c, and the respective auxiliary connection terminals 108a, 108b.

In this case, the second transmission line 121 is formed on the dielectric layer 132, and the fourth transmission line 122 is formed on the dielectric layer 134. Forming the second and fourth transmission lines 121 and 122 on the different dielectric layers can suppress unnecessary electromagnetic coupling between these transmission lines 121 and 122. This prevents the balun 102 from deteriorating in property due to unnecessary electromagnetic coupling.

The dielectric layers 136–138 area is sandwiched between the third shield electrode layer 143 formed on the top surface of the dielectric layer 139 and the second shield electrode layer 142 formed on the top surface of the dielectric layer 135. The dielectric layers 131–134 area is sandwiched between the second shield electrode layer 142 formed on the top surface of the dielectric layer 135 and the first shield electrode layer 141 formed on the top surface of the dielectric layer 130.

The complex high frequency component 100 has the following advantage because the dielectric layers are sandwiched between the above-mentioned shield electrode layers; the complex high frequency component 100 can be free from external noise influence and electromagnetic coupling between the filter 103 and the balun 102. Consequently, the properties of the complex high frequency component 100 can be maintained without deterioration.

The complex high frequency component 100 is produced by stacking the dielectric layers 130–140 and sintering together. As a result, the complex high frequency component 100 has a multilayered integral structure, thereby being downsized as compared with the case where the balun 102 and the filter 103 are mounted on different circuit substrates.

Since the complex high frequency component 100 has the balun 102 and the filter 103 thus integrated, the number of components in the wireless circuit can be reduced. Mounting the complex high frequency component 100 with these features on the transmitter-side wireless circuit unit can achieve miniaturization and cost reduction. Furthermore, the reduction in the number of components can increase the efficiency of producing operation of the communication device 4.

Since the complex high frequency component 100 has the balun 102 and the filter 103 which are integrally stacked, the impedances between the balun 102 and the filter 103 can be easily matched. This eliminates the use of a matching element to match the impedances, thereby further decreasing the number of components. Consequently, the communication device can be further downsized.

The dielectric layers 130–140 composing the complex high frequency component 100 could be different in size and material from the one described in the present embodiment. In other words, similar effects to those in the above embodiment could be obtained when the dielectric layers 130–140 are formed from a material having a different relative permittivity $\in_r$ from the one in the above embodiment. In addition, the dielectric layers 130–140 can be different in size from those described in the above embodiment. The present invention does not require that all the dielectric layers 130–140 be made from the same material; it is possible that at least two of the layers are different from each other in the relative permittivity $\in_r$.

Figure 12A:
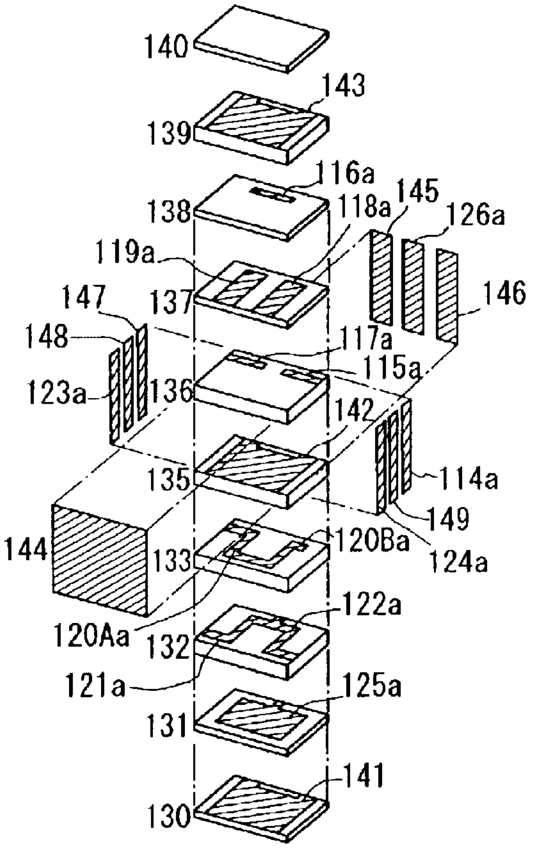
FIG. 12A is an exploded perspective view showing another structure of the complex high frequency components in the second embodiment.

In the present embodiment, the second transmission line electrode layer 121*a* and the fourth transmission line electrode layer 122*a* are formed on different dielectric layers from each other; however, instead of this, these transmission line electrode layers 121*a* and 122*a* can be formed on the same dielectric layer. For example, as shown in FIG. 12A, the fourth transmission line electrode layer 122*a* can be formed on the top surface of the dielectric layer 132 on which the second transmission line electrode layer 121*a* is formed, in the absence of the dielectric layer 134. Alternatively, although it is not illustrated, the second and fourth transmission line electrode layers 121*a* and 122*a* can be provided on the top surface of the dielectric layer 134 in the absence of the dielectric layer 132.

When the second and fourth transmission line electrode layers 121*a* and 122*a* are formed on the same dielectric layer, the complex high frequency component 100 can be composed of fewer dielectric layers although the electromagnetic coupling between the electrode layers 121*a* and 122*a* slightly deteriorates the properties of the balun 102.

Figure 12B:
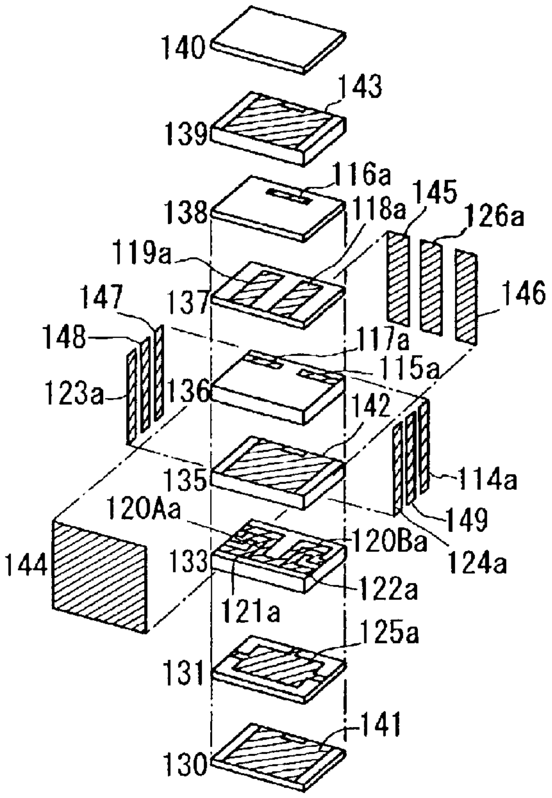
FIG. 12B is an exploded perspective diagram showing further another structure of the complex high frequency components in the second embodiment.
Figure 13:
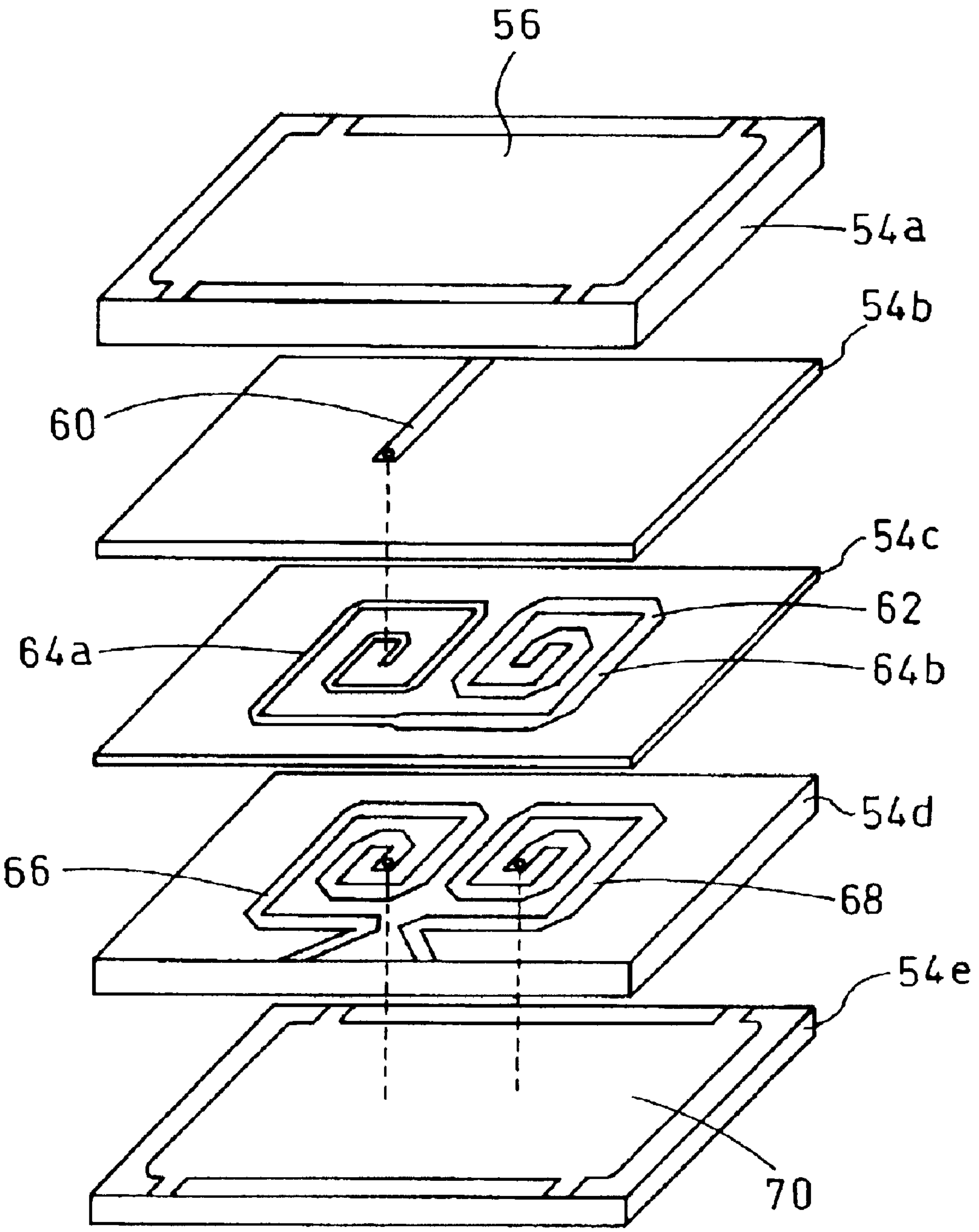
FIG. 13 PRIOR ART
FIG. 13 is an exploded perspective view showing a conventional balun.
Figure 1:
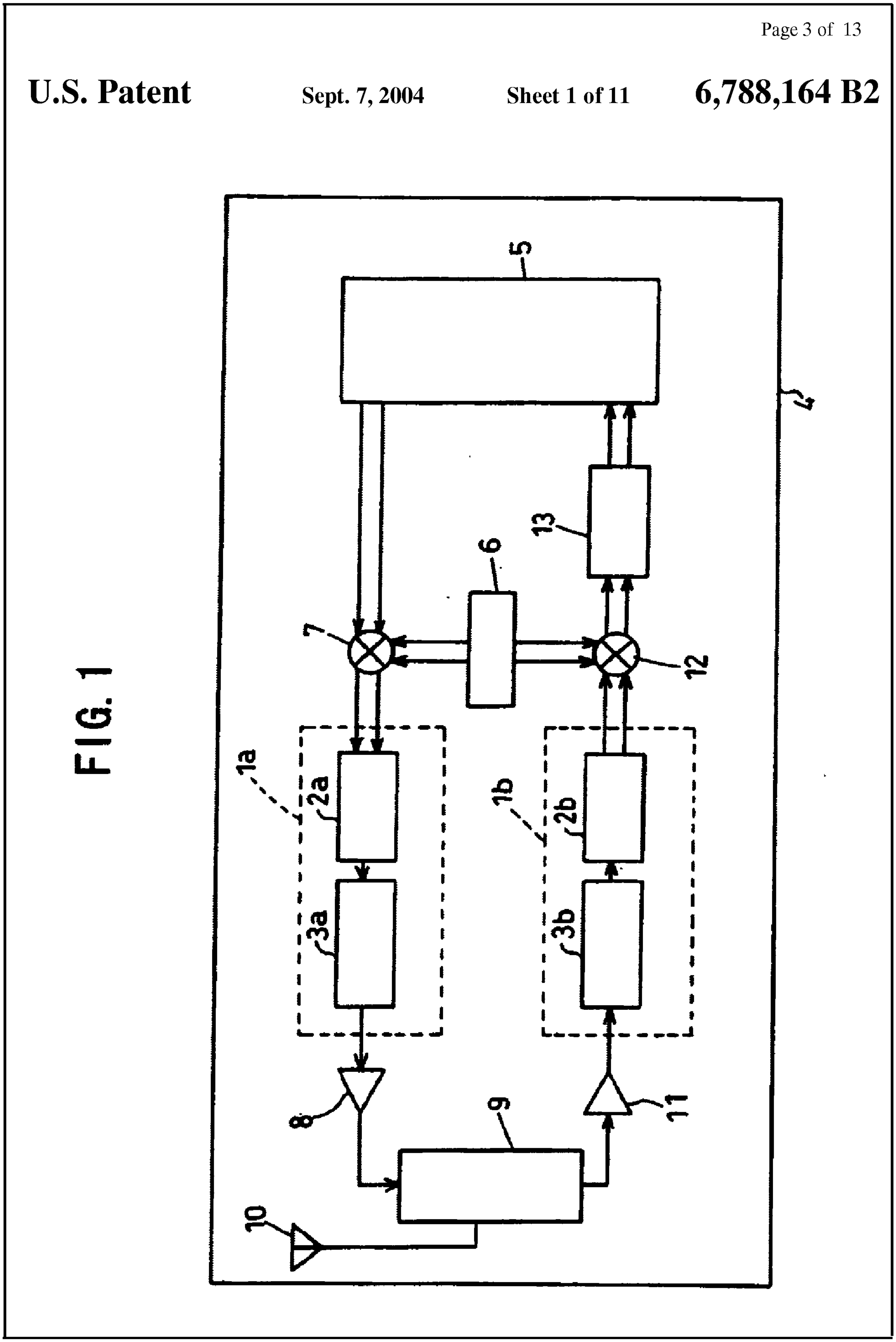
Figure 2:
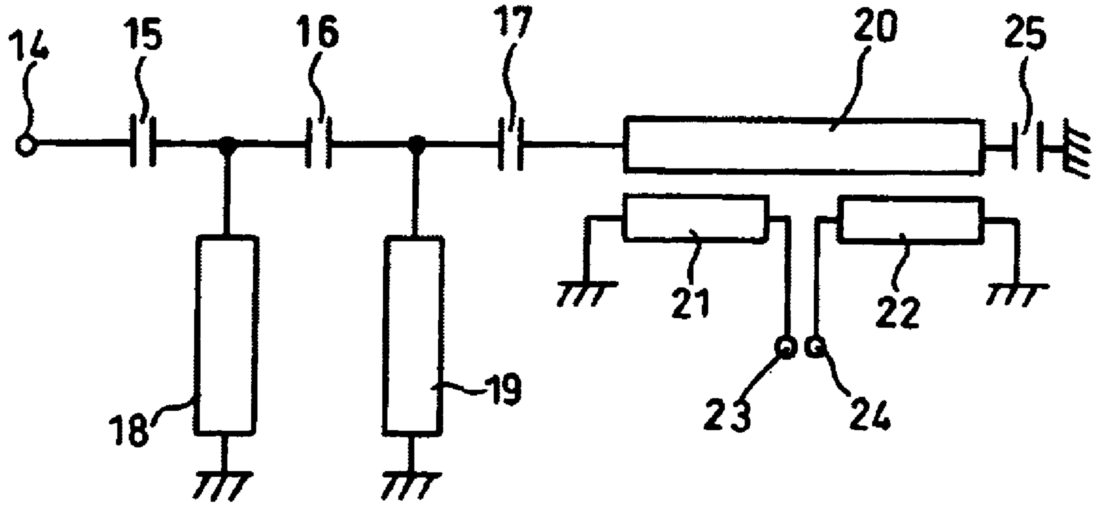
Figure 3:
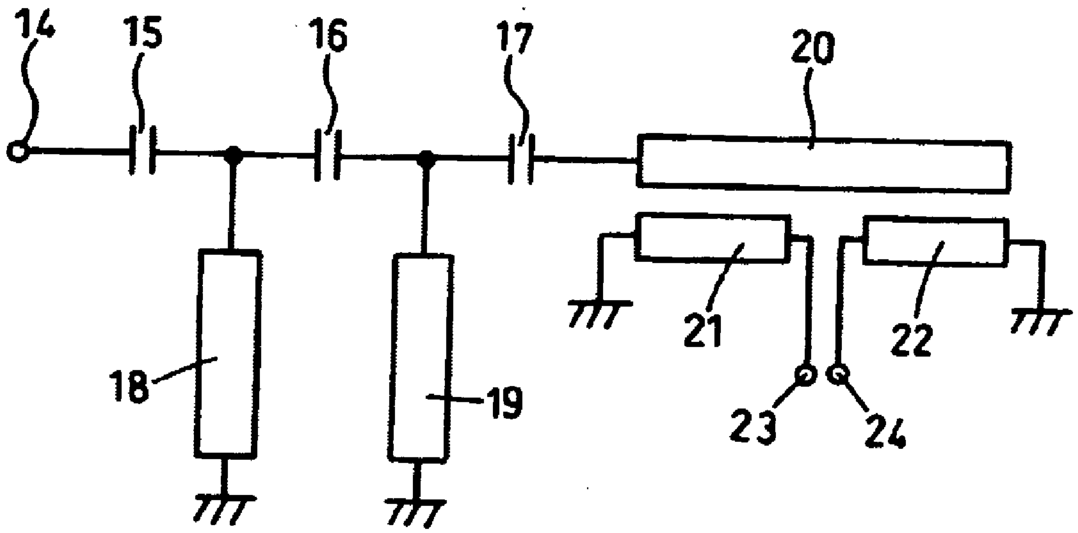
Figure 4:
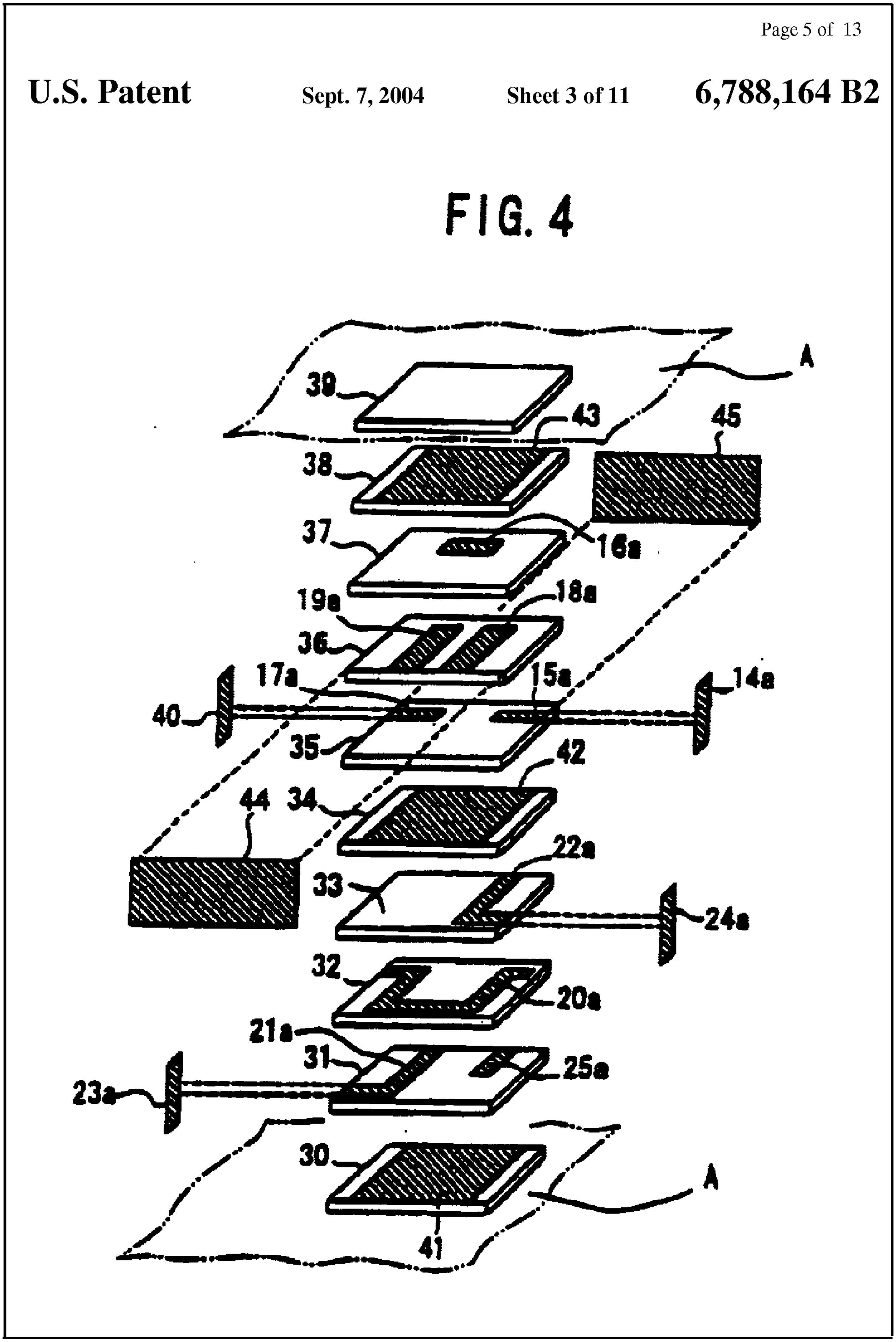
Figure 5:
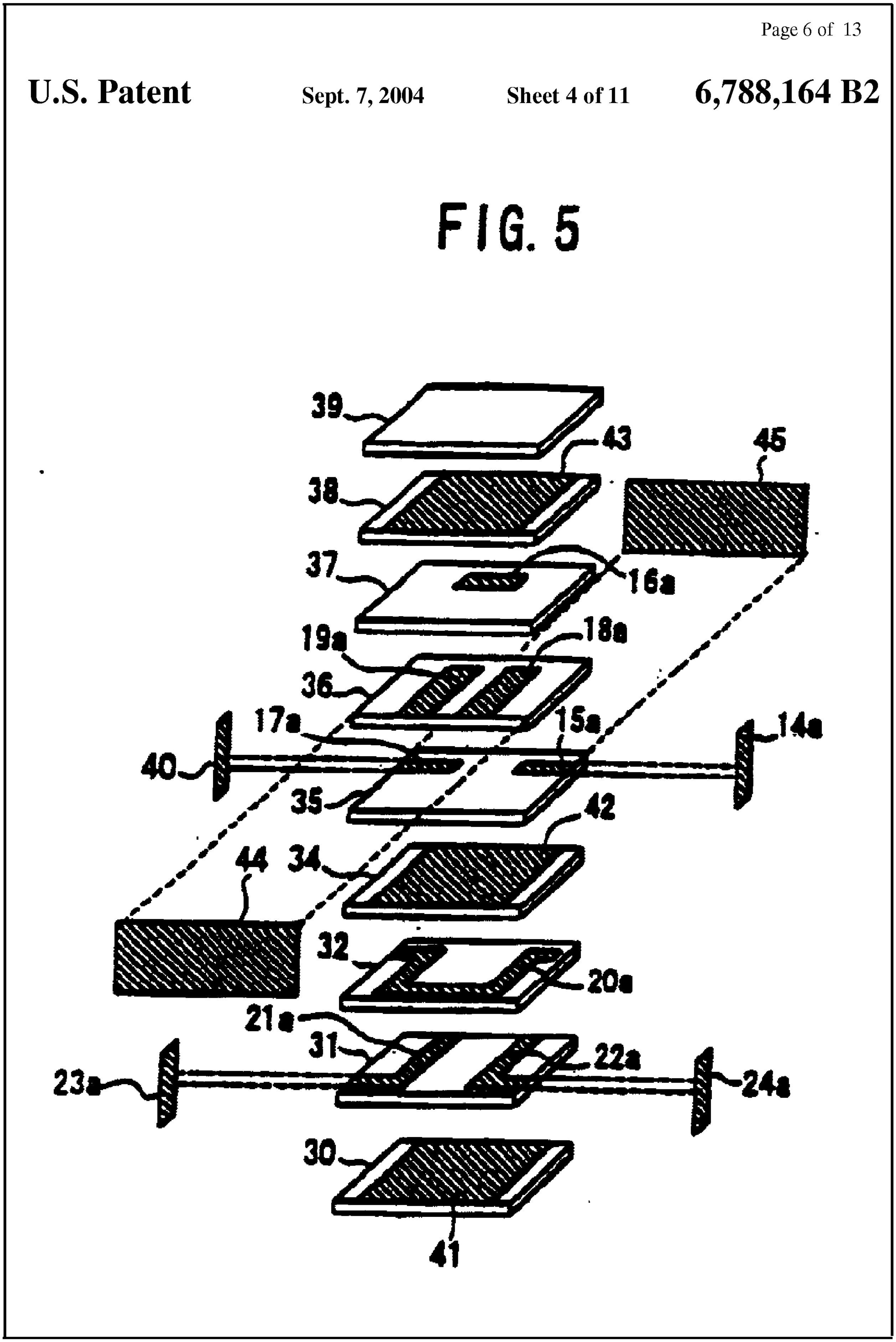
Figure 6:
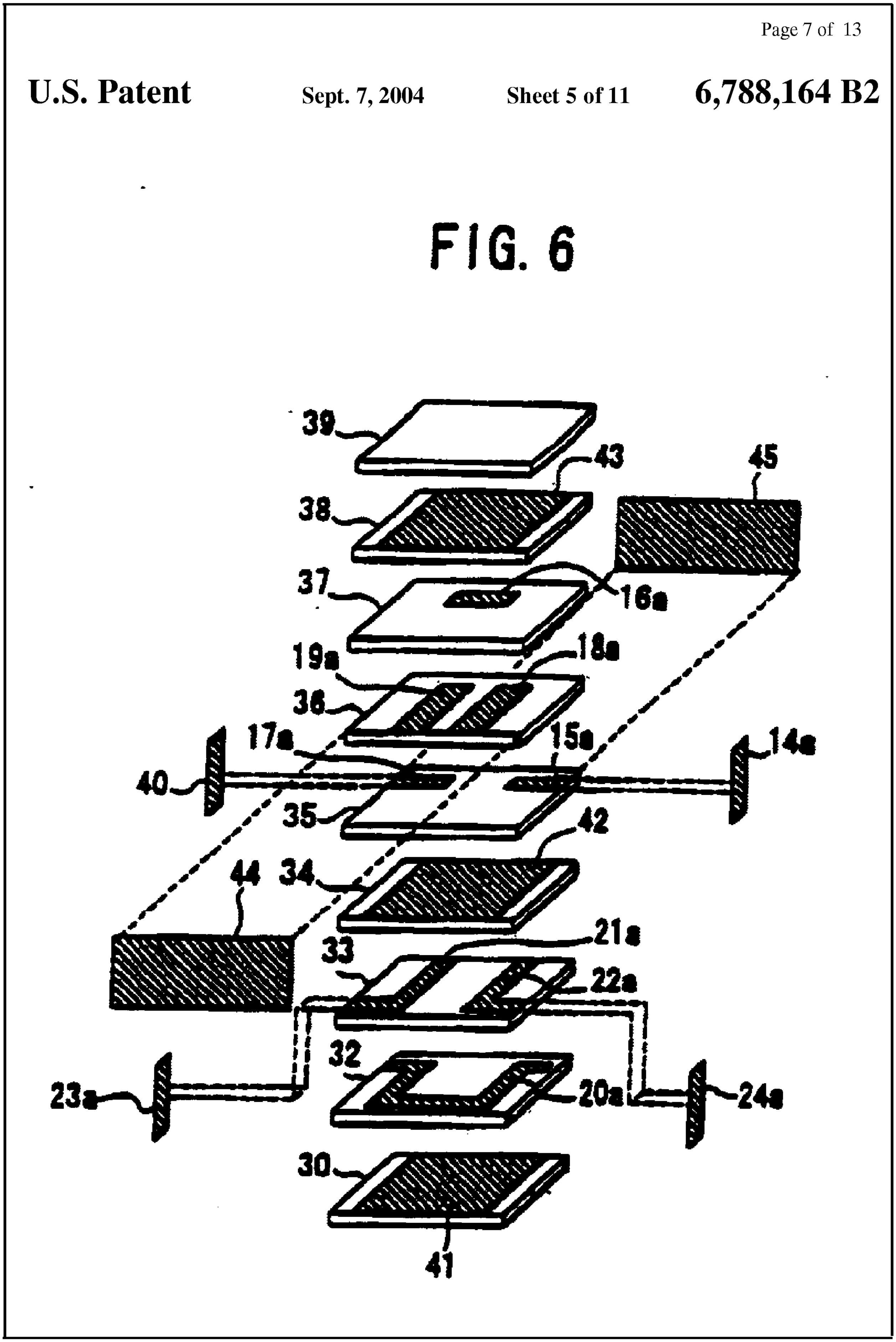
Figure 7:
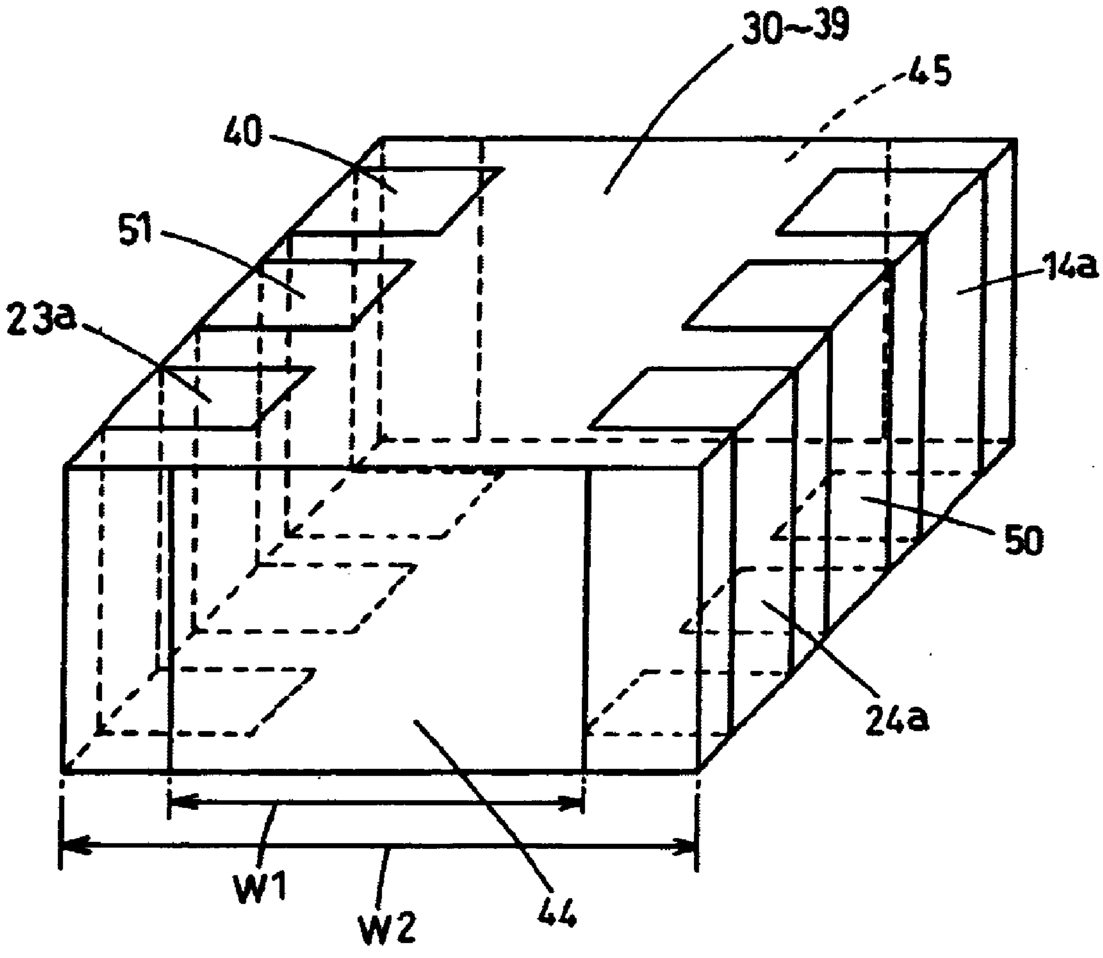
Figure 8:
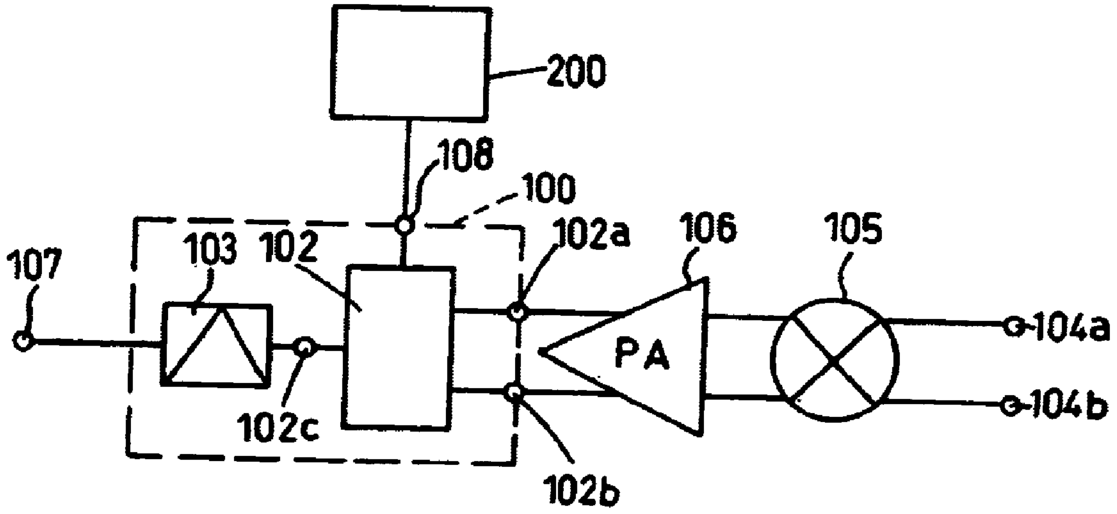
Figure 9:
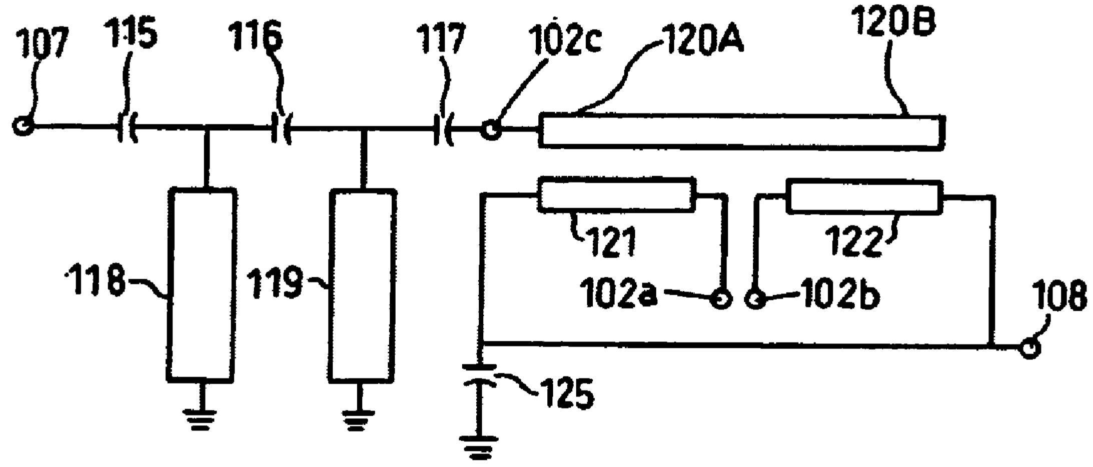
Figure 10:
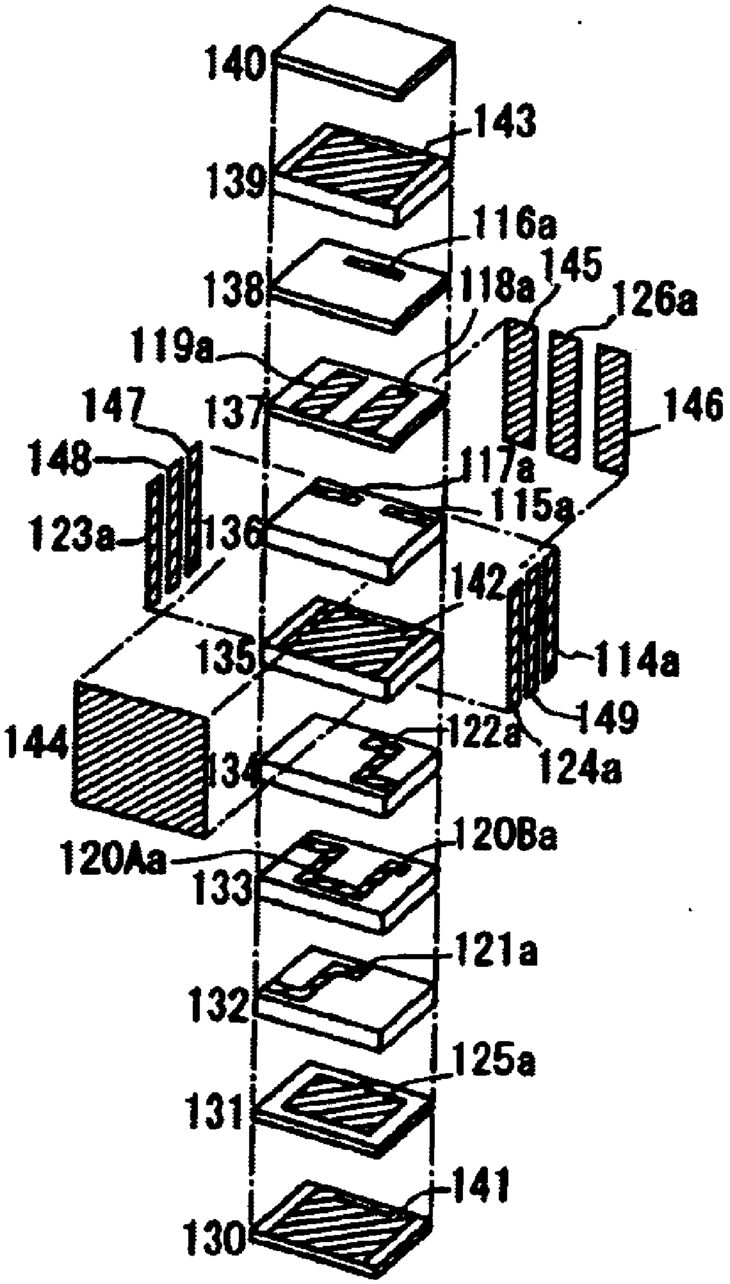
Figure 11A:
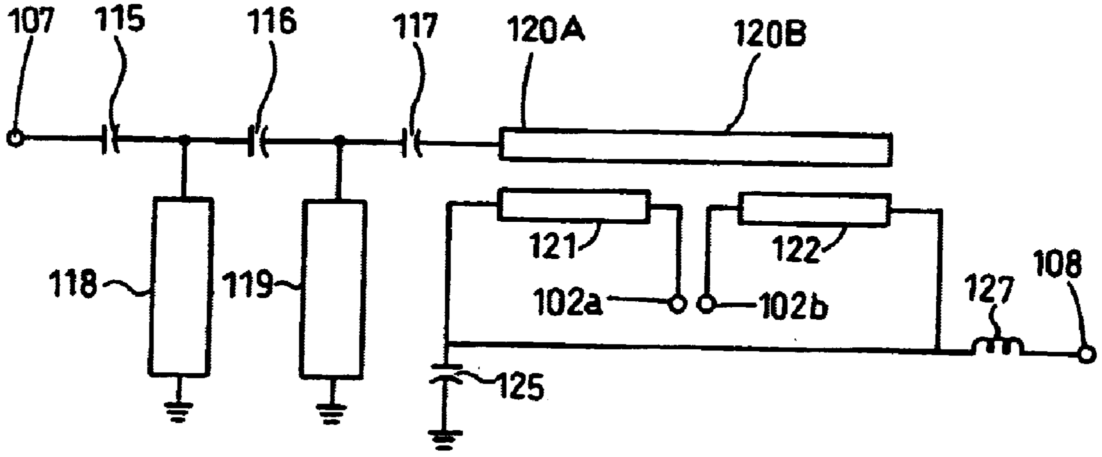
Figure 11B:
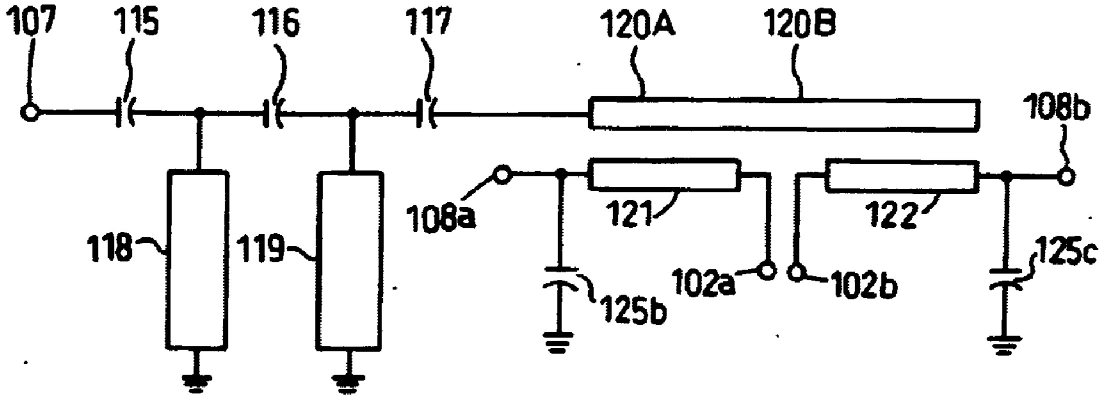
Figure 12A:
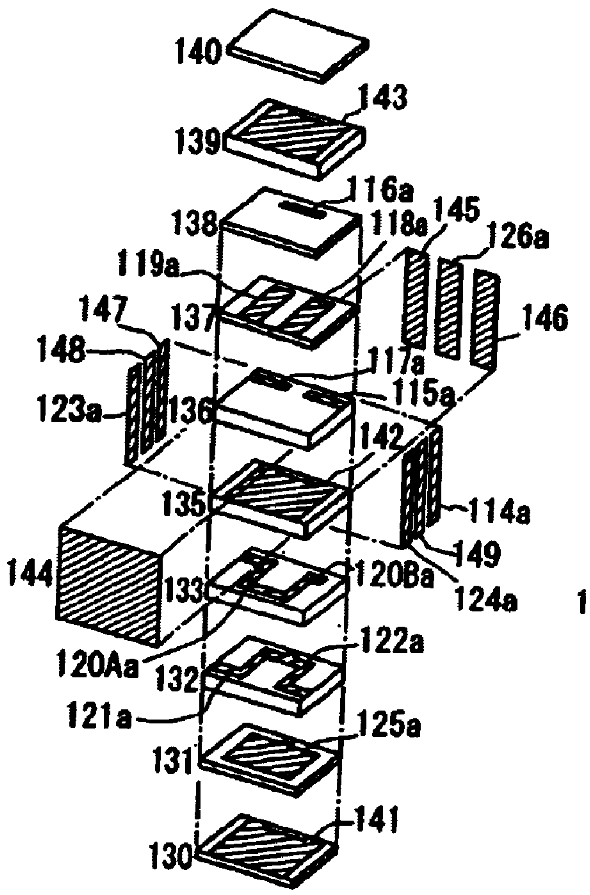
Figure 12B:
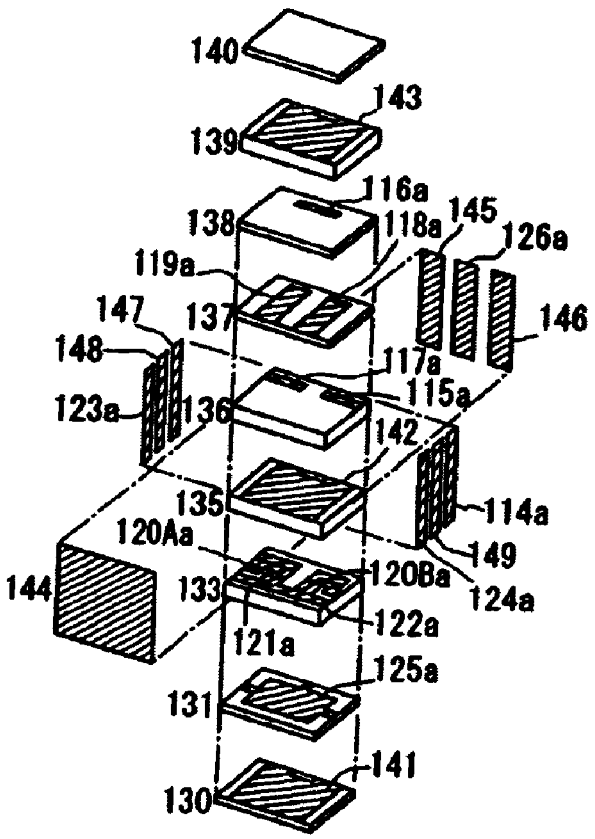
Figure 13:
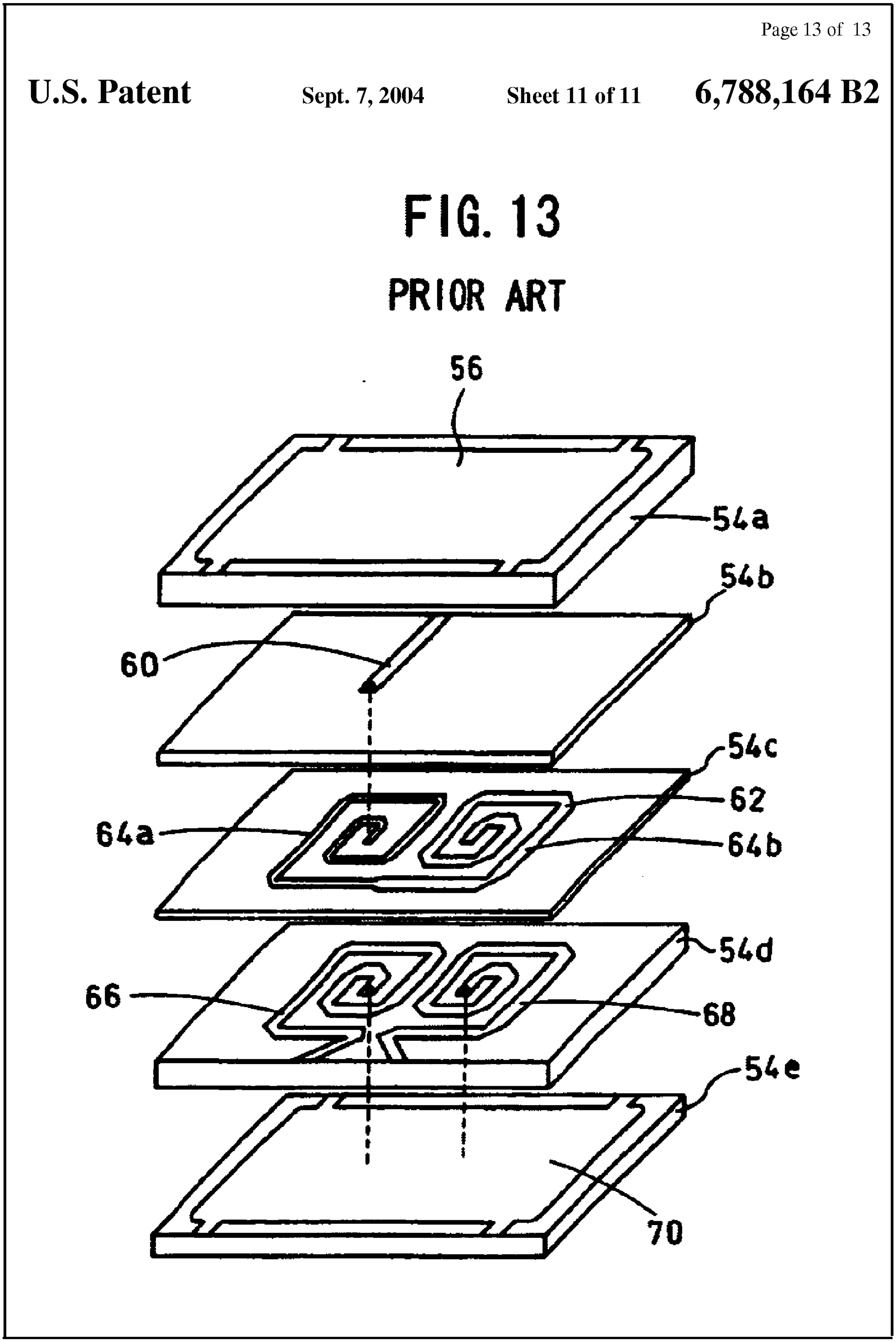
FIG. 13 PRIOR ART

It is also possible that the second and fourth transmission line electrode layers 121*a* and 122*a* are formed on the same dielectric layer as the first transmission line electrode layer 120*a*. For example, as shown in FIG. 12B, the second and fourth transmission line electrode layers 121*a* and 122*a* can be formed on the top surface of the dielectric layer 133 in the absence of the dielectric layers 132, 134.

The dielectric layer 133 already has the first and third transmission line electrode layers 120A*a*, 120B*a* thereon. Forming the second and fourth transmission line electrode layers 121*a* and 122*a* on the same dielectric layer as the first and third transmission line electrode layers 120A*a*, 120B*a* has the following advantage. Coupling the first and third transmission line electrode layers 120A*a*, 120B*a* can further reduce the number of the dielectric layers, although the balun 102 slightly decreases its properties. Consequently, the complex high frequency component 100 can be produced at lower cost and in smaller size.

In the complex high frequency component 100, the balun 102 is connected to the power amplifier 106, and the auxiliary connection terminal 108 is connected to the power supply 200 to make the power supply 200 powers the power amplifier 106 via the balun 102.

The multilayer structure shown in FIG. 10 enables the complex high frequency component 100 of the present invention to be composed with a comparatively simple structure.

In the complex high frequency component 100, the second and fourth transmission line electrode layers 121*a* and 122*a* are connected to each other via the edge electrode 126*a*. This can unify the structure for these electrode layers 121*a*, 122*a* to be connected with an external device, thereby simplifying the structure.

In the complex high frequency component 100, the edge electrode 126*a* which is to be the auxiliary connection terminal 108 is connected to the connection end disposed between the second and fourth transmission line electrode layers 121*a* and 122*a*. This can unify the structure for these electrode layers 121*a*, 122*a* to be connected with the auxiliary connection terminal 108, thereby simplifying the structure.

The present embodiment describes that when the complex high frequency component 100 is mounted on the circuit substrate, the balun 102 is disposed on the side opposing the substrate, and the filter 103 is disposed on the side not opposing the substrate. However, in the present embodiment, the filter 103 could be disposed on the side opposing the substrate and the balun 102 could be disposed on the side not opposing the substrate. Arranging the filter 103 on the side opposing the substrate can strengthen the grounding conditions. In this case, the second and fourth transmission lines 121 and 122 can be formed either on the same dielectric layer or on different dielectric layers from each other.

In the present embodiment, connections between the dielectric layers 130–140 are established by the edge electrodes 114*a*, 123*a*, 124*a*, and 148 formed on sides of the dielectric layers 130–140; however, the present invention is not restricted to this structure. The edge electrodes can be replaced by via electrodes to provide connections between the dielectric layers 130–140.

In general, forming via electrodes costs less than forming edge electrodes. Therefore via electrodes can be used to connect any of the dielectric layers 130–140, thereby reducing the production cost.

The filter 103 could be a notch filter, a low pass filter, or a high pass filter to have the same effects.

The complex high frequency component 100 is composed of 11 dielectric layers 130–140 in the present embodiment; however, the present invention is not restricted to this, and can be composed of another number of dielectric layers depending on the circuit structure of the component 100.

The communication device of the present invention can be other than the transmitter-side wireless circuit of the cellular phone terminal in each of the aforementioned embodiments. For example, the present invention can be applied to a Bluetooth wireless module, a PHS terminal, or the like. In short, the communication device of the present invention has only to use the high frequency component of the present invention in a part of its circuit.

While there has been described what is at present considered to be preferred embodiments of this invention, it will be understood that various modifications may be made therein, and it is intended to cover in the appended claims all such modifications as fall within the true sprit and scope of this invention.

What is claimed is:

1. A complex high frequency component comprising:

a balun for mutually converting a balanced line signal and an unbalanced line signal; and a filter for passing or attenuating predetermined frequency bands, said filter being electrically connected to said balun, said complex high frequency component further comprising:

an electrode layer including a first electrode layer which comprises electrode patterns for said balun and a second electrode layer which comprises electrode patterns for said filter;

a dielectric layer, wherein said dielectric layer and said first and second electrode layers are integrally stacked, and wherein said first electrode layer comprising the electrode pattern of said balun and said second electrode layer comprising the electrode pattern of said filter are arranged in different positions from each other on said dielectric layer, and a first shield electrode layer disposed between said first electrode layer comprising the electrode pattern of said balun and said second electrode layer comprising the electrode pattern of said filter.

2. The complex high frequency component according to claim 1, comprising a plurality of said electrode layers which are stacked with said dielectric layer disposed therebetween.

3. The complex high frequency component according to claim 2, wherein a dielectric constant of said dielectric layer in a filter forming area and a dielectric constant of said dielectric layer in a balun forming area are set at different values from each other.

4. The complex high frequency component according to claim 1, wherein said first electrode layer comprising the electrode pattern of said balun and the second electrode layer comprising the electrode pattern of said filter are stacked with said dielectric layer disposed therebetween.

5. The complex high frequency component according to claim 1, wherein said dielectric layer functions as a circuit structure component for said balun and said filter.

6. The complex high frequency component according to claim 1, further comprising an edge electrode, which is connected to said first shield electrode layer, on a side of the complex high frequency component.

7. The complex high frequency component according to claim 6, wherein said edge electrode has a smaller width than said side.

8. The complex high frequency component of claim 1, wherein said balun is disposed on a mounting side of the complex high frequency component and said filter is disposed on the non-mounting side opposing said mounting side.

9. The complex high frequency component according to claim 1, wherein said filter is disposed on a mounting side of the complex high frequency component and said balun is disposed on the non-mounting side opposing said mounting side.

10. The complex high frequency component according to claim 1, further comprising an edge electrode on a side of the complex high frequency component, wherein said filter and said balun are connected to each other via said edge electrode.

11. The complex high frequency component according to claim 1, further comprising, on a side of the complex high frequency component, an edge electrode connected to said balun and another edge electrode connected to said filter.

12. The complex high frequency component of claim 11, further comprising a shield electrode on said side of said complex high frequency component, said shield electrode being disposed between said edge electrodes.

13. The complex high frequency component according to claim 1, further comprising two edge electrodes disposed on the sides composing a pair of opposing sides respectively, one edge electrode being connected to input/output ends of said balun, and the other edge electrode being connected to input/output ends of said filter.

14. The complex high frequency component according to claim 1, comprising first to tenth dielectric layers stacked in that order, wherein said electrode layer comprises:

a second shield electrode layer disposed between said first dielectric layer and said second dielectric layer;

a second transmission line electrode layer disposed between said second dielectric layer and said third dielectric layer;

a coupling capacitor electrode layer disposed between said second dielectric layer and said third dielectric layer;

a first transmission line electrode layer disposed between said third dielectric layer and said fourth dielectric layer;

a third transmission line electrode layer disposed between said fourth dielectric layer and said fifth dielectric layer;

said first shield electrode layer disposed between said fifth dielectric layer and said sixth dielectric layer;

an input/output coupling capacitor electrode layer disposed between said sixth dielectric layer and said seventh dielectric layer;

a plurality of resonator electrode layers disposed between said seventh dielectric layer and said eighth dielectric layer;

a coupling capacitor electrode layer disposed between said eighth dielectric layer and said ninth dielectric layer; and a third shield electrode layer disposed between said ninth dielectric layer and said tenth dielectric layer, and wherein an edge electrode which connects said input/output coupling capacitor electrode layer and said first transmission line electrode layer is disposed on a side of said first to tenth dielectric layers.

15. The complex high frequency component according to claim 14, wherein said resonator electrode layers are electromagnetically coupled each other.

16. The complex high frequency component according to claim 14, wherein said first transmission line electrode layer and said second transmission line electrode layer are electromagnetically coupled each other, and said first transmission line electrode layer and said third transmission line electrode layer are electromagnetically coupled each other.

17. The complex high frequency component according to claim 1, comprising first to ninth dielectric layers stacked in that order, wherein said electrode layer comprises:

a second shield electrode layer disposed between said first dielectric layer and said second dielectric layer;

a second transmission line electrode layer disposed between said second dielectric layer and said third dielectric layer;

a third transmission line electrode layer disposed between said second dielectric layer and said third dielectric layer;

a first transmission line electrode layer disposed between said third dielectric layer and said fourth dielectric layer;

said first shield electrode layer disposed between said fourth dielectric layer and said fifth dielectric layer;

an input/output coupling capacitor electrode layer disposed between said fifth dielectric layer and said sixth dielectric layer;

a plurality of resonator electrode layers disposed between said sixth dielectric layer and said seventh dielectric layer;

a coupling capacitor electrode layer disposed between said seventh dielectric layer and said eighth dielectric layer; and a third shield electrode layer disposed between said eighth dielectric layer and said ninth dielectric layer, and wherein an edge electrode which connects said input/output coupling capacitor electrode layer and said first transmission line electrode layer is disposed on a side of said first to tenth dielectric layers.

18. The complex high frequency component according to claim 17, wherein said resonator electrode layers are electromagnetically coupled each other.

19. The complex high frequency component according to claim 17, wherein said first transmission line electrode layer and said second transmission line electrode layer are electromagnetically coupled each other, and said first transmission line electrode layer and said third transmission line electrode layer are electromagnetically coupled each other.

20. The complex high frequency component according to claim 1, comprising first to ninth dielectric layers stacked in that order, wherein said electrode layer comprises:

a second shield electrode layer disposed between said first dielectric layer and said second dielectric layer;

a first transmission line electrode layer disposed between said second dielectric layer and said third dielectric layer;

a second transmission line electrode layer disposed between said third dielectric layer and said fourth dielectric layer;

a third transmission line electrode layer disposed between said third dielectric layer and said fourth dielectric layer;

said first shield electrode layer disposed between said fourth dielectric layer and said fifth dielectric layer;

an input/output coupling capacitor electrode layer disposed between said fifth dielectric layer and said sixth dielectric layer;

a plurality of resonator electrode layers disposed between said sixth dielectric layer and said seventh dielectric layer;

a coupling capacitor electrode layer disposed between said seventh dielectric layer and said eighth dielectric layer; and a third shield electrode layer disposed between said eighth dielectric layer and said ninth dielectric layer, and wherein an edge electrode which connects said input/output coupling capacitor electrode layer and said first transmission line electrode layer is disposed on a side of said first to tenth dielectric layers.

21. The complex high frequency component according to claim 20, wherein said resonator electrode layers are electromagnetically coupled each other.

22. The complex high frequency component according to claim 20, wherein said first transmission line electrode layer and said second transmission line electrode layer are electromagnetically coupled each other, and said first transmission line electrode layer and said third transmission line electrode layer are electromagnetically coupled each other.

23. The complex high frequency component according to claim 1, comprising;

a capacitor disposed between said balun and the ground, and an auxiliary connection terminal disposed between said capacitor and said balun.

24. The complex high frequency component according to claim 23, further comprising:

a power supply connected to said auxiliary connection terminal; and an active element which is connected to said balun and is powered from said power supply.

25. The complex high frequency component according to claim 23, wherein said balun has two pairs of transmission lines, one pair of said two pairs of transmission lines having first and second transmission lines electromagnetically coupled with each other, said first transmission line having a first connection terminal at one end, and said second transmission line having a second connection terminal at one end, the other pair of said two pairs of transmission lines having third and fourth transmission lines electromagnetically coupled with each other, said fourth transmission line has a third connection terminal at one end, said second connection terminal and said third connection terminal compose a balanced terminal;

the other end of said first transmission line is coupled with an end of said third transmission line;

the other end of said second transmission line and the other end of said fourth transmission line are grounded via said capacitor; and said auxiliary connection terminal is disposed between the other ends of said second transmission line and said fourth transmission line and said capacitor.

26. The complex high frequency component according to claim 25, wherein the other end of said second transmission line and the other end of said fourth transmission line are mutually connected.

27. The complex high frequency component according to claim 26, wherein said auxiliary connection terminal is connected to a connection end disposed between said second transmission line and said fourth transmission line.

28. The complex high frequency component according to claim 25, wherein each pair of said two pairs of transmission lines is disposed on a same plane.

29. The complex high frequency component according to claim 25, wherein each pair of said two pairs of transmission lines is composed of transmission lines which are arranged to face each other via said dielectric layer.

30. The complex high frequency component according to claim 23, wherein said auxiliary connection terminal is connected to said balun via an inductance.

31. The complex high frequency component according to claim 23, wherein said capacitor is composed of said dielectric layer and said electrode layer.

32. The complex high frequency component according to claim 23, wherein an inductance is disposed between said auxiliary connection terminal and said balun, and said inductance, said dielectric layer and said electrode layer are integrally stacked.

33. A communication device having the complex high frequency component according to claim 1.

* * * * *

UNITED STATES PATENT AND TRADEMARK OFFICE

CERTIFICATE OF CORRECTION

PATENT NO. : 6,788,164 B2

DATED : September 7, 2004

INVENTOR(S) : Tomoya Maekawa et al.

It is certified that error appears in the above-identified patent and that said Letters Patent is hereby corrected as shown below:

The title page, showing the illustrative figure should be deleted to be replaced with the attached title page.

Drawing sheets, consisting of Figs. 1-12, should be deleted to be replaced with the drawing sheets, consisting of Figs. 1-12, as shown on the attached pages.

Signed and Sealed this

Fifteenth Day of November, 2005

JON W. DUDAS

*Director of the United States Patent and Trademark Office*

(12) United States Patent
Maekawa et al.

(10) Patent No.: US 6,788,164 B2
(45) Date of Patent: Sep. 7, 2004

(54) COMPLEX HIGH FREQUENCY COMPONENTS

(75) Inventors: Tomoya Maekawa, Osaka (JP); Hiroshi Shigemura, Kyoto (JP); Hideaki Nakakubo, Kyoto (JP); Emiko Kawahara, Osaka (JP); Toru Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/209,893

(22) Filed: Aug. 2, 2002

(65) Prior Publication Data

US 2003/0025571 A1 Feb. 6, 2003

(30) Foreign Application Priority Data

Aug. 3, 2001 (JP) .................................... P2001-236830
May 27, 2002 (JP) .................................... P2002-152437

(51) Int. Cl.[7] .................................................. H03H 5/00
(52) U.S. Cl. .......................... 333/26; 333/25; 333/202; 333/204; 333/219
(58) Field of Search ........................... 333/25, 26, 202, 333/204, 219; 174/255

(56) References Cited

U.S. PATENT DOCUMENTS

| | | | | | |
|---|---|---|---|---|---|
| 4,803,453 | A | * | 2/1989 | Tomono et al. | 336/183 |
| 5,497,137 | A | * | 3/1996 | Fujiki | 336/200 |
| 6,525,626 | B2 | * | 2/2003 | Mandai et al. | 333/134 |
| 2002/0034934 | A1 | * | 3/2002 | Watanabe et al. | 455/318 |
| 2002/0175002 | A1 | * | 11/2002 | Sakakura et al. | 174/255 |
| 2003/0020568 | A1 | * | 1/2003 | Mizutani et al. | 333/204 |

FOREIGN PATENT DOCUMENTS

JP 7-176918 7/1995

* cited by examiner

*Primary Examiner*—Michael Tokar
*Assistant Examiner*—Khai Nguyen
(74) *Attorney, Agent, or Firm*—McDermott Will & Emery LLP

(57) ABSTRACT

The present invention comprises baluns **2*a*, 2*b* which convert balanced line signals and unbalanced line signals mutually, and filters 3*a*, 3*b* which are electrically connected to the baluns 2*a*, 2*b* and pass or attenuate the predetermined frequency bands. Electrode layers 15*a*–22*a*, 25*a*, 41, 42, 43 which compose the electrode patterns of the baluns 2*a*, 2*b* and the filters 3*a*, 3*b*, and the dielectric layers 30–39** are integrally stacked.

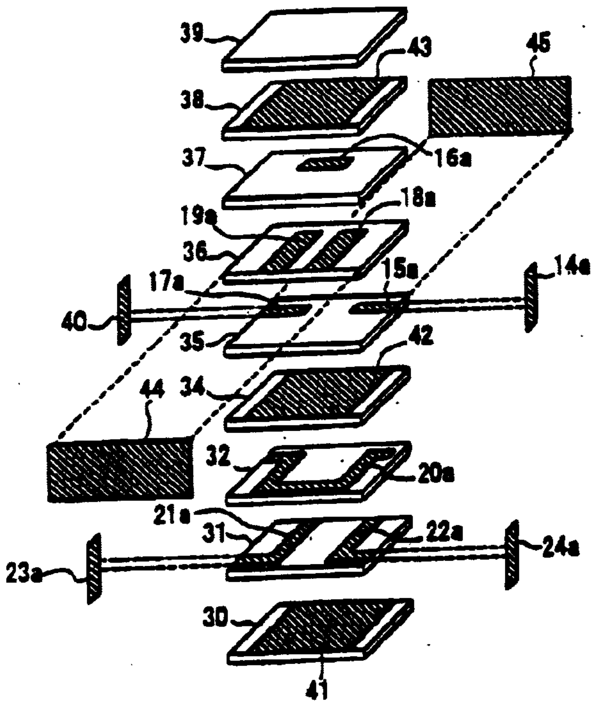

33 Claims, 12 Drawing Sheets